(12) United States Patent
Yim et al.

(10) Patent No.: US 11,581,263 B2
(45) Date of Patent: Feb. 14, 2023

(54) SEMICONDUCTOR PACKAGE, AND PACKAGE ON PACKAGE HAVING THE SAME

(71) Applicant: Samsung Electronics Co., Ltd., Suwon-si (KR)

(72) Inventors: Choongbin Yim, Seoul (KR); Jungwoo Kim, Osan-si (KR); Jihwang Kim, Cheonan-si (KR); Jungsoo Byun, Seoul (KR); Jongbo Shim, Asan-si (KR); Doohwan Lee, Cheonan-si (KR); Kyoungsei Choi, Yongin-si (KR); Junggon Choi, Seongnam-si (KR); Sungeun Pyo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 61 days.

(21) Appl. No.: 17/024,852

(22) Filed: Sep. 18, 2020

(65) Prior Publication Data
US 2021/0257305 A1    Aug. 19, 2021

(30) Foreign Application Priority Data

Feb. 18, 2020    (KR) ........................ 10-2020-0019995

(51) Int. Cl.
*H01L 23/495*    (2006.01)
*H01L 23/538*    (2006.01)
*H01L 25/10*    (2006.01)

(52) U.S. Cl.
CPC ...... *H01L 23/5389* (2013.01); *H01L 23/5384* (2013.01); *H01L 23/5386* (2013.01); *H01L 25/105* (2013.01)

(58) Field of Classification Search
CPC ............. H01L 23/5389; H01L 23/5384; H01L 23/5386; H01L 2224/0233
USPC .......................................................... 257/686
See application file for complete search history.

(56) References Cited

U.S. PATENT DOCUMENTS

| 8,716,065 | B2 * | 5/2014 | Chi | ................... | H01L 23/49816 |
| | | | | | 438/126 |
| 8,980,691 | B2 * | 3/2015 | Lin | ......................... | H01L 25/50 |
| | | | | | 438/666 |
| 9,653,442 | B2 | 5/2017 | Yu et al. | | |
| 9,728,498 | B2 * | 8/2017 | Su | ..................... | H01L 23/49894 |

(Continued)

FOREIGN PATENT DOCUMENTS

KR    101859340 B1    5/2018

*Primary Examiner* — Nitin Parekh
(74) *Attorney, Agent, or Firm* — Muir Patent Law, PLLC

(57) ABSTRACT

A semiconductor package includes: a redistribution layer including a plurality of redistribution insulating layers, a plurality of redistribution line patterns that constitute lower wiring layers, and a plurality of redistribution vias that are connected to some of the plurality of redistribution line patterns while penetrating at least one of the plurality of redistribution insulating layers; at least one semiconductor chip arranged on the redistribution layer; an expanded layer surrounding the at least one semiconductor chip on the redistribution layer; and a cover wiring layer including at least one base insulating layer, a plurality of wiring patterns that constitute upper wiring layers, and a plurality of conductive vias that are connected to some of the plurality of wiring patterns while penetrating the at least one base insulating layer.

20 Claims, 17 Drawing Sheets

(56) References Cited

U.S. PATENT DOCUMENTS

| | | | |
|---|---|---|---|
| 9,735,131 B2* | 8/2017 | Su | H01L 24/19 |
| 10,026,671 B2 | 7/2018 | Yu et al. | |
| 10,050,024 B2 | 8/2018 | Hung et al. | |
| 10,347,611 B2 | 7/2019 | Kim et al. | |
| 10,361,177 B2 | 7/2019 | Kim et al. | |
| 2010/0059854 A1* | 3/2010 | Lin | H01L 25/50 |
| | | | 257/528 |
| 2016/0118333 A1* | 4/2016 | Lin | H01L 25/16 |
| | | | 257/773 |
| 2017/0188458 A1* | 6/2017 | Hsieh | H05K 1/115 |
| 2017/0330767 A1 | 11/2017 | Kang et al. | |
| 2018/0076179 A1 | 3/2018 | Hsu et al. | |
| 2018/0190581 A1* | 7/2018 | Lin | H01L 21/76895 |
| 2019/0131241 A1 | 5/2019 | Jeng et al. | |
| 2019/0139915 A1* | 5/2019 | Dalmia | H01L 23/552 |
| 2019/0189572 A1* | 6/2019 | Chiang | H01L 23/5226 |
| 2019/0326222 A1* | 10/2019 | Chavali | H01L 23/5386 |

* cited by examiner

SEMICONDUCTOR PACKAGE, AND PACKAGE ON PACKAGE HAVING THE SAME

CROSS-REFERENCE TO RELATED APPLICATION

This application claims the benefit of priority under 35 U.S.C. § 119 of Korean Patent Application No. 10-2020-0019995, filed on Feb. 18, 2020, in the Korean Intellectual Property Office, the disclosure of which is incorporated herein in its entirety by reference.

BACKGROUND

The invention concept relates to a semiconductor package, and a package on package having the same, and more particularly, to a fan-out semiconductor package, and a package on package having the same.

Due to the rapid development of the electronics industry and the needs of users, electronic devices are becoming more and more miniaturized, multifunctional, and high-capacity, and thus, there is increased demand for highly integrated semiconductor chips.

Accordingly, a semiconductor package having connection terminals secured with connection reliability has been devised for a highly integrated semiconductor chip in which the number of connection terminals for input/output (I/O) is increased. For example, in order to prevent interference between the connection terminals, a fan-out semiconductor package with an increased spacing between the connection terminals has been developed.

SUMMARY

The inventive concept provides a semiconductor package suitable for miniaturization, multi-functionality and high-capacity of electronic devices, and a package on package having the same.

In order to achieve the above technical problem, the inventive concept provides the following semiconductor package, and a package on package having the same.

According to an aspect of the inventive concept, there is provided a semiconductor package including: a redistribution layer including a plurality of redistribution insulating layers, a plurality of redistribution line patterns that constitute lower wiring layers on upper and lower surfaces of each of the plurality of redistribution insulating layers, and a plurality of redistribution vias that are connected to some of the plurality of redistribution line patterns while penetrating at least one of the plurality of redistribution insulating layers; at least one semiconductor chip arranged on the redistribution layer; an expanded layer surrounding the at least one semiconductor chip on the redistribution layer; and a cover wiring layer including at least one base insulating layer, a plurality of wiring patterns that constitute upper wiring layers on upper and lower surfaces of the at least one base insulating layer, and a plurality of conductive vias that are connected to some of the plurality of wiring patterns while penetrating the at least one base insulating layer; wherein the number of the lower wiring layers is greater than the number of the upper wiring layers, and wherein a first thickness of the redistribution layer is less than a second thickness of the cover wiring layer.

According to an aspect of the inventive concept, there is provided a semiconductor package including: a redistribution layer including a plurality of redistribution insulating layers, each having a first thickness and a redistribution conductive structure, wherein the redistribution conductive structure includes a plurality of redistribution line patterns that constitute lower wiring layers on upper and lower surfaces of each of the plurality of redistribution insulating layers and a plurality of redistribution vias that are connected to some of the plurality of redistribution line patterns while penetrating at least one of the plurality of redistribution insulating layers, and wherein the redistribution layer has a second thickness; at least one semiconductor chip arranged on the redistribution layer; an expanded layer surrounding the at least one semiconductor chip on the redistribution layer; and a cover wiring layer including at least one base insulating layer having a third thickness and a wiring structure, wherein the wiring structure includes a plurality of wiring patterns that constitute upper wiring layers on upper and lower surfaces of the at least one base insulating layer and a plurality of conductive vias that are connected to some of the plurality of wiring patterns while penetrating the at least one base insulating layer, and wherein the cover wiring layer has a fourth thickness; wherein the number of the lower wiring layers is greater than the number of the upper wiring layers, and wherein the first thickness is less than the third thickness and the second thickness is less than the fourth thickness.

According to an aspect of the inventive concept, there is provided a package on package including: a first semiconductor package including a redistribution layer, a first semiconductor chip, an expanded layer, and a cover wiring layer, wherein the redistribution layer includes a plurality of redistribution insulating layers that each has a first thickness and a redistribution conductive structure, wherein the redistribution conductive structure includes a plurality of redistribution line patterns that constitute lower wiring layers on upper and lower surfaces of each of the plurality of redistribution insulating layers and a plurality of redistribution vias that are connected to some of the plurality of redistribution line patterns while penetrating at least one of the plurality of redistribution insulating layers, and wherein the redistribution layer has a second thickness, wherein the first semiconductor chip is arranged on the redistribution layer and electrically connected to the redistribution conductive structure, wherein the expanded layer surrounds the first semiconductor chip, wherein the cover wiring layer includes at least one base insulating layer having a third thickness greater than the first thickness and a wiring structure, wherein the wiring structure includes a plurality of wiring patterns that constitute upper wiring layers on upper and lower surfaces of the at least one base insulating layer and a plurality of conductive vias that are connected to some of the plurality of wiring patterns while penetrating the at least one base insulating layer, and wherein the cover wiring layer has a fourth thickness greater than the second thickness; and a second semiconductor package stacked on the first semiconductor package, wherein the second semiconductor package includes at least one second semiconductor chip and a package connection terminal that is attached to a portion of the wiring structure to electrically connect the at least one second semiconductor chip to the first semiconductor package.

BRIEF DESCRIPTION OF THE DRAWINGS

Embodiments of the inventive concept will be more clearly understood from the following detailed description taken in conjunction with the accompanying drawings in which like numbers refer to like elements throughout. In the drawings.

DETAILED DESCRIPTION OF THE EMBODIMENTS

Figure 1A:
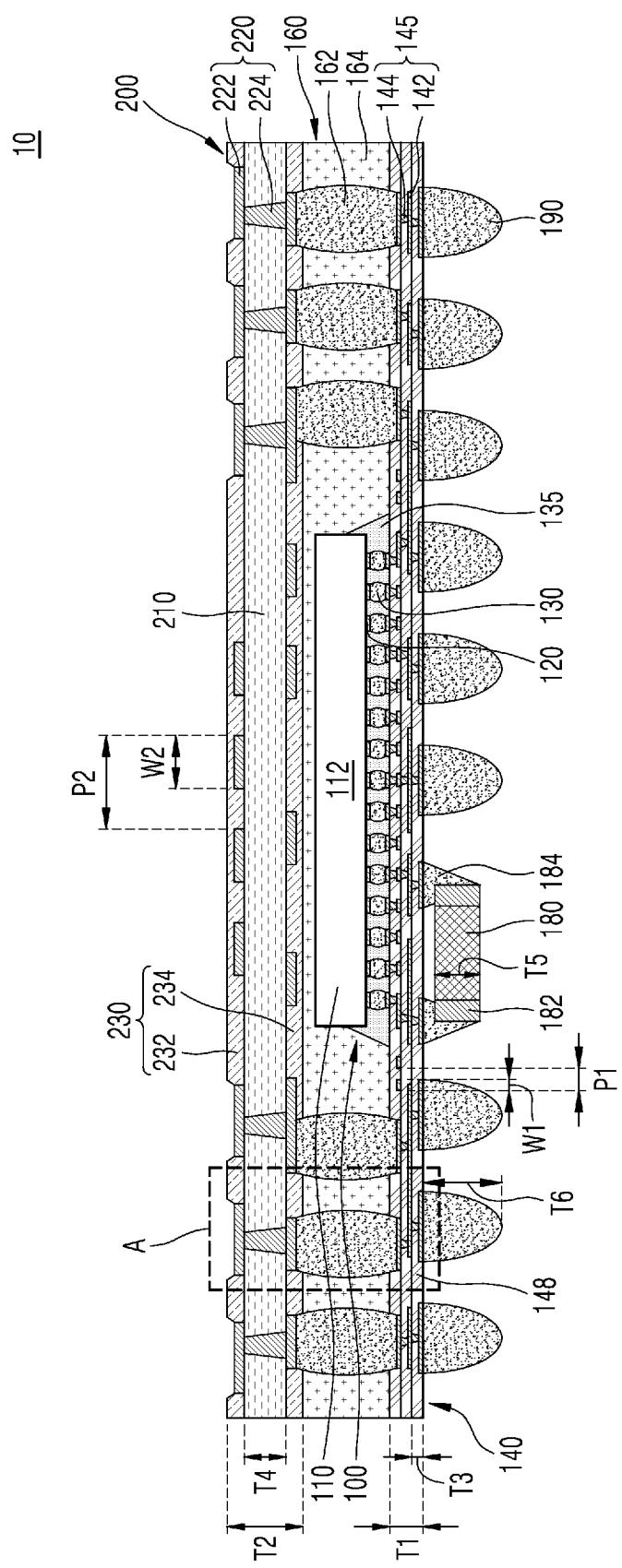
FIG. 1A is a cross-sectional view of a semiconductor package, according to example embodiments of the inventive concept.
Figure 1B:
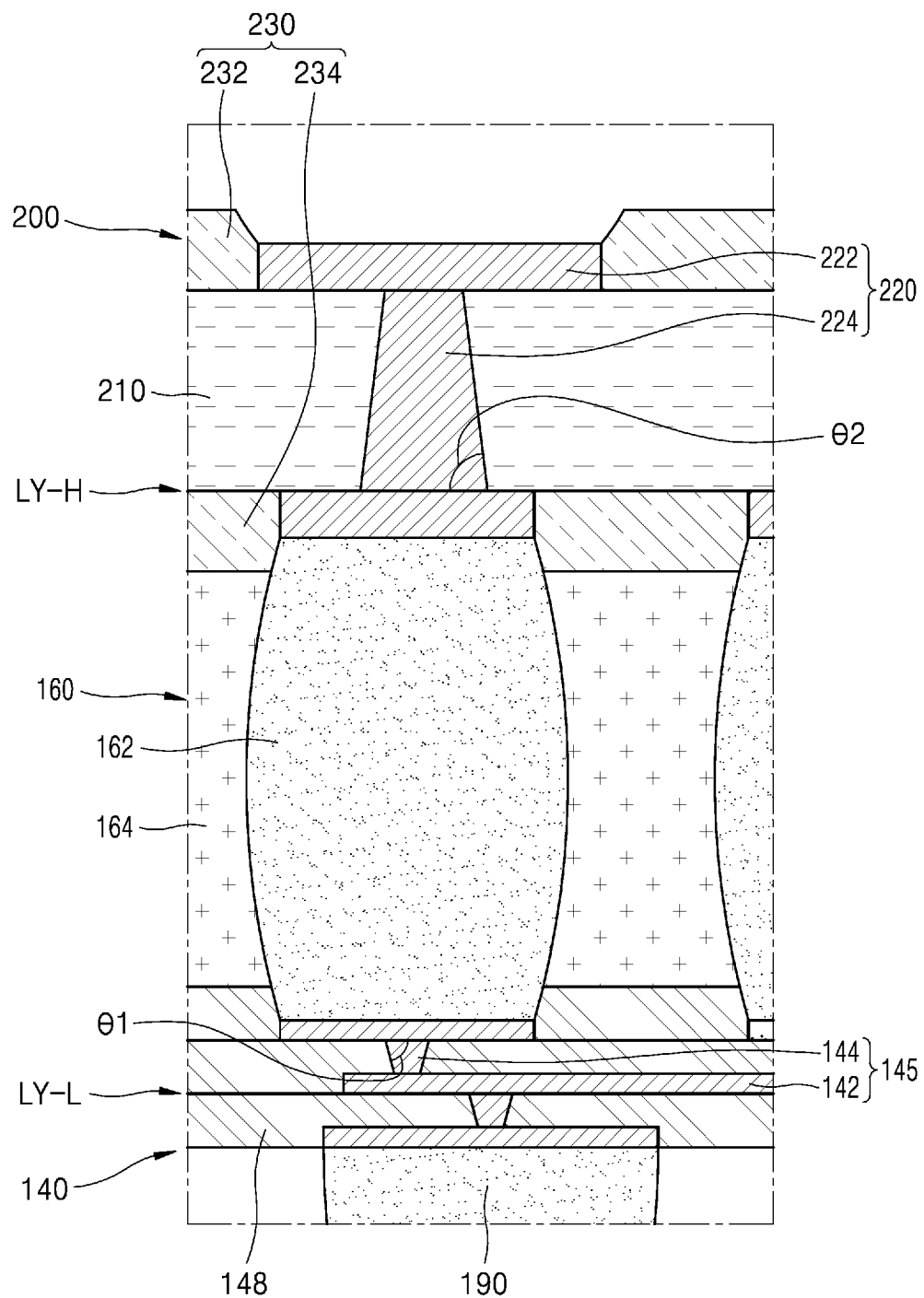
FIG. 1B is an enlarged cross-sectional view of a portion of the semiconductor package of FIG. 1A, according to example embodiments of the inventive concept.

FIG. 1A is a cross-sectional view of a semiconductor package, according to example embodiments of the inventive concept, and FIG. 1B is an enlarged cross-sectional view of a portion of the semiconductor package, according to example embodiments of the inventive concept, specifically, an enlarged cross-sectional view of portion A of FIG. 1A.

Referring to FIGS. 1A and 1B together, the semiconductor package 10 may include a redistribution layer 140, an expanded layer 160 arranged on the redistribution layer 140, and at least one semiconductor chip 100, and a cover wiring layer 200 arranged on the expanded layer 160. The expanded layer 160 may surround the at least one semiconductor chip 100. For example, the expanded layer 160 may cover upper and side surfaces of the at least one semiconductor chip 100.

The semiconductor package 10 may include a fan out semiconductor package in which a horizontal width and a horizontal area of the redistribution layer 140 may be greater than the horizontal width and the horizontal area of a footprint constituted by the at least one semiconductor chip 100. In addition, the semiconductor package 10 may include a fan out semiconductor package in which a horizontal width and a horizontal area of the cover wiring layer 200 may be greater than the horizontal width and the horizontal area of a footprint constituted by the at least one semiconductor chip 100. For example, when the semiconductor package 10 includes one semiconductor chip 100, each of the horizontal width and horizontal area of the redistribution layer 140 and the horizontal width and horizontal area of the cover wiring layer 200 may be greater than the horizontal width and horizontal area of the one semiconductor chip 100. In some embodiments, the horizontal widths and the horizontal areas of the redistribution layer 140, the expanded layer 160, and the cover wiring layer 200 may be the same.

The redistribution layer 140 and the cover wiring layer 200 may be referred to as a lower wiring structure and an upper wiring structure, respectively. For example, the semiconductor package 10 may include the expanded layer 160, in which the at least one semiconductor chip 100 is arranged, and the lower wiring structure and the upper wiring structure respectively covering lower and upper surfaces of the expanded layer 160.

The redistribution layer 140 may include a redistribution conductive structure 145 and a plurality of redistribution insulating layers 148. The redistribution conductive structure 145 may include a plurality of redistribution line patterns 142 that are arranged on at least one of upper and lower surfaces of each of a plurality of redistribution insulating layers 148, and a plurality of redistribution vias 144 penetrating at least one redistribution insulating layer 148 and respectively contacting and connecting to some of the plurality of redistribution line patterns 142. The plurality of redistribution line patterns 142 and the plurality of redistribution vias 144 may include metal such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or alloys thereof, but are not limited thereto.

At least some of the plurality of redistribution line patterns 142 may be formed together with some of the plurality of redistribution vias 144 to be one body. For example, some of the plurality of redistribution line patterns 142 may be formed together to be integral with some of the plurality of redistribution vias 144 that contact an upper side of some of the plurality of redistribution line patterns 142, or may be formed together to be integral with some of the plurality of redistribution vias 144 that contact a lower side of some of the plurality of redistribution line patterns 142. The term "contact," as used herein, refers to a direct connection (i.e., touching) unless the context indicates otherwise.

In some embodiments, the plurality of redistribution vias 144 may include a tapered shape, in which the horizontal width thereof is narrowed from an upper side to a lower side. For example, the horizontal width of the plurality of redistribution vias 144 may be narrowed as they move away from the semiconductor chip 100. In example embodiments, the sidewalls of the plurality of redistribution vias 144 may be substantially linear.

A redistribution seed layer may be interposed between the plurality of redistribution line patterns 142 and the plurality of redistribution insulating layers 148, and between the redistribution vias 144 and the plurality of redistribution insulating layers 148. For example, the redistribution seed layer may be formed by performing physical vapor deposition, and the plurality of redistribution line patterns 142 and the plurality of redistribution vias 144 may be formed by performing electroless plating using the redistribution seed layer as a seed. In some embodiments, the redistribution seed layer may be interposed between an upper surface of each of the plurality of redistribution line patterns 142 and the plurality of redistribution vias 144 and any one of the redistribution insulating layer 148, and may be interposed between a side surface of the plurality of redistribution vias 144 and any one of the plurality of redistribution insulating layers 148.

The redistribution seed layer may include, for example, copper (Cu), titanium (Ti), titanium tungsten (TiW), titanium nitride (TiN), tantalum (Ta), tantalum nitride (TaN), chromium (Cr), aluminum (Al) and the like. However, the redistribution seed layer is not limited to these materials. In some embodiments, the redistribution seed layer may include Cu/Ti where copper is stacked on titanium, or Cu/TiW where copper is stacked on titanium tungsten.

In some embodiments, when copper (Cu) is used as the plurality of redistribution line patterns 142 and the plurality of redistribution vias 144, at least a portion of the redistribution seed layer may act as a diffusion barrier layer.

Each of the plurality of redistribution insulating layers 148 may include, for example, a material film including an organic compound. In some embodiments, the plurality of redistribution insulating layers 148 may include a material film including an organic polymer material. For example, each of the plurality of redistribution insulating layers 148 may include photo imagable dielectric (PID), Ajinomoto build-up film (ABF), or photosensitive polyimide (PSPI).

Each of the at least one semiconductor chip 100 may include a semiconductor substrate 110, in which a semiconductor device 112 is formed on an active surface thereof, and a plurality of chip connection pads 120 arranged on the active surface of the semiconductor substrate 110. In some embodiments, when the semiconductor package 10 is a lower package of a package on package (PoP), the semiconductor package 10, the semiconductor chip 100, the semiconductor substrate 110, the semiconductor device 112, and the chip connection pad 120 may be respectively referred to as a first semiconductor package, a first semiconductor chip, a first semiconductor substrate, a first semiconductor device, and a first chip connection pad.

The semiconductor substrate 110 may include, for example, a semiconductor material such as silicon (Si). Alternatively, the semiconductor substrate 110 may include a semiconductor element such as germanium (Ge), or a compound semiconductor such as silicon carbide (SiC), gallium arsenide (GaAs), indium arsenide (InAs), and indium phosphide (InP). The semiconductor substrate 110 may include a conductive region, for example, a well doped with impurities. The semiconductor substrate 110 may include various device isolation structures, such as a shallow trench isolation (STI) structure.

The semiconductor device 112 including a plurality of individual devices of various types may be formed on the active surface of the semiconductor substrate 110. The plurality of individual devices may include various microelectronic devices, for example, a metal-oxide-semiconductor field effect transistor (MOSFET) such as a complementary metal-insulator-semiconductor (CMOS) transistor, a system large scale integration (LSI), an image sensor such as a CMOS imaging sensor (CIS), a micro-electro-mechanical system (MEMS), an active device, a passive device, and the like. The plurality of individual devices may be electrically connected to the conductive region of the semiconductor substrate 110. The semiconductor device 112 may further include a conductive wiring or a conductive plug that electrically connects at least two of the plurality of individual devices to each other, or connects the plurality of individual devices to the conductive region of the semiconductor substrate 110. In addition, each of the plurality of individual devices may be electrically isolated from other adjacent individual devices by an insulating film.

The semiconductor chip 100 may include, for example, a central processing unit (CPU) chip, a graphics processing unit (GPU) chip, or an application processor (AP) chip. In some embodiments, when the semiconductor package 10 includes a plurality of semiconductor chips 100, some of the plurality of semiconductor chips 100 may include, for example, a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, a resistive random access memory (RRAM) chip, etc.

The plurality of chip connection pads 120 of the semiconductor chip 100 that are electrically connected to the semiconductor device 112 may be electrically connected to the redistribution conductive structure 145. A plurality of chip connection terminals 130 may be arranged between some of the redistribution line patterns 142 to be arranged on an uppermost wiring layer among the plurality of redistribution line patterns 142 or some of the redistribution vias 144 to be arranged on the uppermost wiring layer of the plurality of redistribution vias 144 and the plurality of chip connection pads 120, to electrically connect at least one semiconductor chip 100 to the redistribution layer 140.

An underfill layer 135 surrounding the plurality of chip connection terminals 130 may be interposed between the at least one semiconductor chip 100 and the redistribution layer 140. The underfill layer 135 may include, for example, an epoxy resin formed by a capillary under-fill method. In some embodiments, the underfill layer 350 may include a non-conductive film (NCF).

The expanded layer 160 may include a plurality of connection structures 162 and a filling portion 164 surrounding the plurality of connection structures 162 and at least one semiconductor chip 100. The plurality of connection structures 162 may penetrate the filling portion 164 to electrically connect to the redistribution layer 140 to the cover wiring layer 200. Upper and lower ends of each of the plurality of connection structures 162 may be in contact with any one of the plurality of wiring patterns 222 of the cover wiring layer 200 and any one of the plurality of redistribution line patterns 142 of the redistribution layer 140, respectively. For example, an upper surface of each of the plurality of connection structures 162 may contact a lower surface of a corresponding one of the plurality of wiring patterns 222, and a lower surface of each of the plurality of connection structures 162 may contact an upper surface of a corresponding one of the plurality of redistribution line patterns 142. The upper surfaces of each of the plurality of connection structures 162 may be at a vertical level between upper and lower surfaces of a lower surface solder resist layer 234, and the lower surfaces of each of the plurality of connection structures 162 may be at a vertical level between upper and lower surfaces of an uppermost one of the redistribution insulating layers 148.

Each of the plurality of connection structures 162 may include a through mold via (TMV), a conductive solder, a conductive pillar, or at least one conductive bump. In some embodiments, each of the plurality of connection structures 162 may include a lower portion formed to be attached to any one of the plurality of redistribution line patterns 142 of the redistribution layer 140 and an upper portion formed to be attached to any one of the plurality of wiring patterns 222 of the cover wiring layer 200, wherein the lower and upper portions may be formed by soldering in order to form an one body through reflowing by heat.

The filling portion 164 may include, for example, epoxy mold compound (EMC). The filling portion 164 may surround the semiconductor chip 100. In some embodiments, the filling portion 164 may cover side and inactive surfaces of the at least one semiconductor chip 100. In some other embodiments, the filling portion 164 may cover the side surface of the at least one semiconductor chip 100, but may not cover the inactive surface thereof.

The cover wiring layer 200 may include, for example, a printed circuit board (PCB), a ceramic substrate, a wafer for package manufacturing, an interposer, or the like. In some embodiments, the cover wiring layer 200 may include a multi-layer printed circuit board.

The cover wiring layer 200 may include at least one base insulating layer 210 and a wiring structure 220. The wiring structure 220 may include a plurality of wiring patterns 222 and a plurality of conductive vias 224, wherein the plurality of wiring patterns 222 may be arranged on at least one of an upper surface and a lower surface of the at least one base insulating layer 210, and the plurality of conductive vias 224 may penetrate the at least one base insulating layer 210 to be respectively connected to a portion of the plurality of wiring patterns 222. The wiring structure 220 may include copper, nickel, stainless steel, or beryllium copper.

The base insulating layer 210 may include at least one material selected from phenol resin, epoxy resin, and polyimide. The base insulating layer 210 may include at least one material selected from, for example, frame retardant 4 (FR-4), tetrafunctional epoxy, polyphenylene ether, epoxy/polyphenylene oxide, bismaleimide triazine (BT), thermount, cyanate ester, polyimide, and liquid crystal polymer.

A solder resist layer 230 exposing a portion of the plurality of wiring patterns 222 may be formed on upper and lower surfaces of the at least one base insulating layer 210. The solder resist layer 230 may include an upper surface solder resist layer 232 and a lower surface solder resist layer 234. The upper surface solder resist layer 232 may expose a portion of the plurality of wiring patterns 222 while covering an upper surface of the at least one base insulating layer 210, and the lower surface solder resist layer 234 may expose a portion of the plurality of wiring patterns 222 while covering a lower surface of the at least one base insulating layer 210. For example, the upper surface solder resist layer 232 may not cover upper surfaces of the plurality of wiring patterns 222 provided on an upper surface of the at least one base insulating layer 210, and the lower surface solder resist layer 234 may not cover lower surfaces of the plurality of wiring patterns 222 provided on a lower surface of the at least one base insulating layer 210. In some embodiments, the upper surface solder resist layer 232 may be formed on the upper surface of the at least one base insulating layer 210, but the lower surface solder resist layer 234 may not be formed on the lower surface thereof.

A plurality of external connection terminals 190 to be electrically connected to the redistribution conductive structure 145 may be attached to a lower surface of the redistribution layer 140. In some embodiments, at least a portion of the redistribution line pattern 142 to be arranged on a lowermost wiring layer among the plurality of redistribution line patterns 142 may function as a terminal connection pad to which the external connection terminal 190 may be attached.

The horizontal width and horizontal area of the footprint constituted by the plurality of external connection terminals 190 may be greater than the horizontal width and horizontal area of the footprint constituted by the at least one semiconductor chip 100. For example, some of the plurality of external connection terminals 190 may be arranged outside in a horizontal direction from the footprint constituted by the at least one semiconductor chip 100, thereby not overlapping the footprint constituted by the at least one semiconductor chip 100 in a vertical direction.

For example, the semiconductor package 10 may include a chip last fan out semiconductor package, in which the redistribution layer 140 is first formed and then the expanded layer 160 and the at least one semiconductor chip 100 is mounted on the redistribution layer 140. In some embodiments, the semiconductor package 10 may include a fan out panel level package (FOPLP). In some other embodiments, the semiconductor package 10 may include a fan out wafer level package (FOWLP).

In some embodiments, at least one passive device 180 may be attached to the lower surface of the redistribution layer 140. The at least one passive device 180 may include a surface-mount device (SMD). For example, the at least one passive device 180 may include a capacitor or a resistor. A terminal portion 182 of the at least one passive device 180 may be electrically connected to a portion of the plurality of redistribution line patterns 142 of the redistribution layer 140, through a solder portion 184 to be arranged on a plurality of redistribution line patterns 142 of the redistribution layer 140.

The semiconductor package 10 may be formed by forming the redistribution layer 140 on a carrier substrate, forming the at least one semiconductor chip 100 and the expanded layer 160 on the redistribution layer 140, attaching the cover wiring layer 200 on the expanded layer 160, and then removing the carrier substrate therefrom. After attaching the at least one semiconductor chip 100 on the redistribution layer 140, the filling portion 164 surrounding the at least one semiconductor chip 100 may be formed. In some embodiments, the plurality of connecting structures 162 may be attached on the redistribution layer 140 before forming the filling portion 164 on the redistribution layer 140. In some other embodiments, the plurality of connecting structures 162 may be formed by first attaching a lower conductive solder constituting a lower portion of the plurality of connecting structures 162 on the redistribution layer 140, forming the filling portion 164, removing a portion of the filling portion 164 so that the lower conductive solder is exposed, arranging on the filling portion 164 the cover wiring layer 200 to which an upper conductive solder constituting an upper portion of the plurality of connecting structures 162 is attached, and then performing a reflow process using heat so that the lower conductive solder and the upper conductive solder may be soldered.

Since the redistribution layer 140 may be formed on the carrier substrate, the plurality of redistribution vias 144 may be formed by forming a plurality of redistribution via holes that penetrate at least one of the plurality of redistribution insulating layers 148, and then filling the plurality of redistribution via holes with a conductive material. Therefore, each of the plurality of redistribution vias 144 may include the tapered shape in which the horizontal width thereof narrows from the upper side to the lower side. For example, each of the plurality of redistribution vias 144 may be narrower in width as they move away from the semiconductor chip 100.

The cover wiring layer 200 may be formed separately from the redistribution layer 140 and the expanded layer 160, and then may be attached to the expanded layer 160 covering the redistribution layer 140. In some embodiments, each of the plurality of conductive vias 224 may include the tapered shape in which the horizontal width thereof widens from the upper side to the lower side, that is, in which the horizontal width thereof may be narrowed while moving away from the semiconductor chip 100, but the embodiments are not limited thereto. For example, sidewalls of the conductive vias 224 may be substantially linear. In some embodiments, each of the plurality of conductive vias 224 may include the tapered shape in which the horizontal width thereof is narrowed from the upper side to the lower side, that is, in which the horizontal width thereof may be widened while moving away from the semiconductor chip 100. For example, in consideration of the characteristics of the semiconductor package 10, the cover wiring layer 200 may be attached to the expanded layer 160 in the direction in which the horizontal width thereof is narrowed as each of the plurality of conductive vias 224 moves away from the semiconductor chip 100. Alternatively, the cover wiring layer 200 may be attached to the expanded layer 160 in the direction in which the horizontal width thereof is widened as each of the plurality of conductive vias 224 moves away from the semiconductor chip 100.

A first angle θ1, which is a base angle of each of the plurality of redistribution vias 144, may be less than a second angle θ2, which is the base angle of each of the plurality of conductive vias 224. In some embodiments, the first angle θ1 may be between about 60° and about 75°, and the second angle θ2 may be between about 80° and about 90°.

Here, the base angle of each of the plurality of redistribution vias 144 and the plurality of conductive vias 224 may refer to an angle between a surface having a greater horizontal width among the upper and lower surfaces of each of the plurality of redistribution vias 144 and the plurality of conductive vias 224 and a side surface thereof, and may also refer to an acute angle of the angle between the upper and side surfaces of each of the plurality of redistribution vias 144 and the plurality of conductive vias 224 and the angle between the lower and side surfaces of each of the plurality of redistribution vias 144 and the plurality of conductive vias 224. For example, the base angle of each of the plurality of redistribution vias 144 and the plurality of conductive vias 224 may refer to the angle between a base which is longer subtense of a pair of parallel subtense and a hypotenuse, when viewed from a vertical cross section of each of the plurality of redistribution vias 144 and the plurality of conductive vias 224.

A place where the redistribution line pattern 142 may be arranged and thus to be a circuit wiring, among the upper and lower surfaces of the plurality of the redistribution insulating layer 148 included in the redistribution layer 140, and between two adjacent redistribution insulating layers 148, and a place where a wiring pattern 222 may be arranged and thus to be a circuit wiring, among the upper and lower surfaces of the at least one base insulating layer 210 included in the cover wiring layer 200, may be referred to as a wiring layer. In some embodiments, when the cover wiring layer 200 includes a plurality of base insulating layers 210, the wiring layer may be the place where the wiring pattern 222 may be arranged and thus to be the circuit wiring, among the upper and lower surfaces of the plurality of base insulating layer 210, and between two adjacent base insulating layers 210.

The wiring layer of the redistribution layer 140 may be referred to as a lower wiring layer LY-L, and the wiring layer of the cover wiring layer 200 may be referred to as an upper wiring layer LY-H. In some embodiments, the number of lower wiring layers LY-L may be one more than the number of redistribution insulating layers 148 included in the redistribution layer 140. Also, in some embodiments, the number of the upper wiring layers LY-H may be one more than the number of the at least one base insulating layer 210 included in the cover wiring layer 200. Each of the lower wiring layers LY-L may be at a different vertical level, and the number of lower wiring layers LY-L may correspond to the number of levels at which the lower wiring layers LY-L are provided. Each of the upper wiring layers LY-H may be at a different vertical level, and the number of upper wiring layers LY-H may correspond to the number of levels at which the upper wiring layers LY-H are provided.

The number of lower wiring layers LY-L may be greater than the number of upper wiring layers LY-H. For example, when the number of upper wiring layers LY-H is 2, the number of lower wiring layers LY-L may be 3 or more, and when the number of upper wiring layers LY-H is 3, the number of lower wiring layers LY-L may be 4 or more.

A first thickness T1, which is a thickness of the redistribution layer 140, may be less than a second thickness T2, which is a thickness of the cover wiring layer 200. For example, the first thickness T1 may be about 30 μm to about 50 μm, and the second thickness T2 may be about 60 μm to about 90 μm.

A third thickness T3, which is a thickness of one redistribution insulating layer 148 included in the redistribution layer 140, may be less than a fourth thickness T4, which is a thickness of one base insulation layer 210 included in the cover wiring layer 200. For example, the third thickness T3 may be about 5 μm to about 20 μm, and the fourth thickness T4 may be about 25 μm to about 60 μm. In some embodiments, a thickness of each of the upper surface solder resist layer 232 and the lower surface solder resist layer 234 may be about 5 μm to about 15 μm.

The number of lower wiring layers LY-L of the redistribution layer 140 may be greater than the number of upper wiring layers LY-H of the cover wiring layer 200, but the first thickness T1 of the redistribution layer 140 may be less than the second thickness T2 of the cover wiring layer 200.

Widths and pitches of the plurality of wiring patterns 222 that extend along the upper wiring layer LY-H may be greater than widths and pitches of the plurality of redistribution line patterns 142 that extend along the lower wiring layer LY-L. Each of the plurality of redistribution line patterns 142 and the plurality of wiring patterns 222 may have various widths. For example, a portion of the plurality of redistribution line patterns 142 that is connected to the plurality of connection structures 162 or a portion of the plurality of redistribution line patterns 142 that is connected to the plurality of external connection terminals 190 may have relatively large widths, considering the horizontal widths of the plurality of connection structures 162 and external connection terminals 190. Similarly, a portion of the plurality of wiring patterns 222 that is connected to the plurality of connection structures 162 or a portion of the plurality of wiring patterns 222 that is exposed without being covered by the upper surface solder resist layer 232 may have relatively large widths, considering the horizontal widths of the plurality of connection structures 162 and the horizontal widths of the plurality of package connection terminals 460 in FIG. 11.

In some embodiments, a thickness of the plurality of wiring patterns 222 may be greater than a thickness of the plurality of redistribution line patterns 142. For example, the thickness of the plurality of wiring patterns 222 may be less than the fourth thickness T4, and the thickness of the plurality of redistribution line patterns 142 may be less than the third thickness T3.

A first width W1 and a first pitch P1, which are a minimum width and a minimum pitch of the plurality of redistribution line patterns 142, may be less than a second width W2 and a second pitch P2, which are the minimum width and the minimum pitch of the plurality of wiring patterns 222. In some embodiments, each of the second width W2 and the second pitch P2 may have values 10 times greater than each of the first width W1 and the first pitch P1. For example, the first width W1 may be about 5 μm to about 10 μm, and the first pitch P1 may be about 10 μm to about 25 μm. For example, the second width W2 may be about 100 μm to about 300 μm, and the second pitch P2 may be about 150 μm to about 700 μm.

At least one passive device 180 may have a fifth thickness T5, and each of the plurality of external connection terminals 190 may have a sixth thickness T6. The sixth thickness T6 may also be referred to as the height of each of the plurality of external connection terminals 190. The fifth thickness T5 may be greater than the first thickness T1. The fifth thickness T5 may be less than the sixth thickness T6. For example, the fifth thickness T5 may be about 70 μm to about 120 μm. For example, the sixth thickness T6 may be about 100 μm to about 150 μm, but may be greater than the fifth thickness T5.

At least one passive device 180 may have the fifth thickness T5 that is greater than the first thickness T1, which is the thickness of the redistribution layer 140, but less than the sixth thickness T6 of each of the plurality of external connection terminals 190. Therefore, even if at least one passive device 180 is not embedded in the redistribution layer 140 and is attached to the lower surface of the redistribution layer 140, the overall thickness of the semiconductor package 10 may not be increased.

In the semiconductor package 10 according to the inventive concept, since the redistribution layer 140 having a larger number of wiring layers may have a relatively thin thickness, the overall thickness of the semiconductor package 10 may be reduced. Therefore, even if the electronic device including the semiconductor package 10 is multifunctional and has a large capacity, the thickness of the semiconductor package 10 may be reduced, so that the electronic device may be miniaturized.

In addition, when an upper package is attached to the semiconductor package 10 as a lower package, to form the package on package, since the semiconductor package 10 according to the inventive concept may have the cover wiring layer 200 that may have a relatively small number of wiring layers, in which the cover wiring layer 200 has a relatively thick thickness, the upper package may be supported by the cover wiring layer 200, so that it is possible to prevent warpage from occurring in the semiconductor package 10, which is the lower package. Therefore, by using the semiconductor package 10 according to the inventive concept as the lower package, the package on package may be provided with structural reliability.

Figure 2:
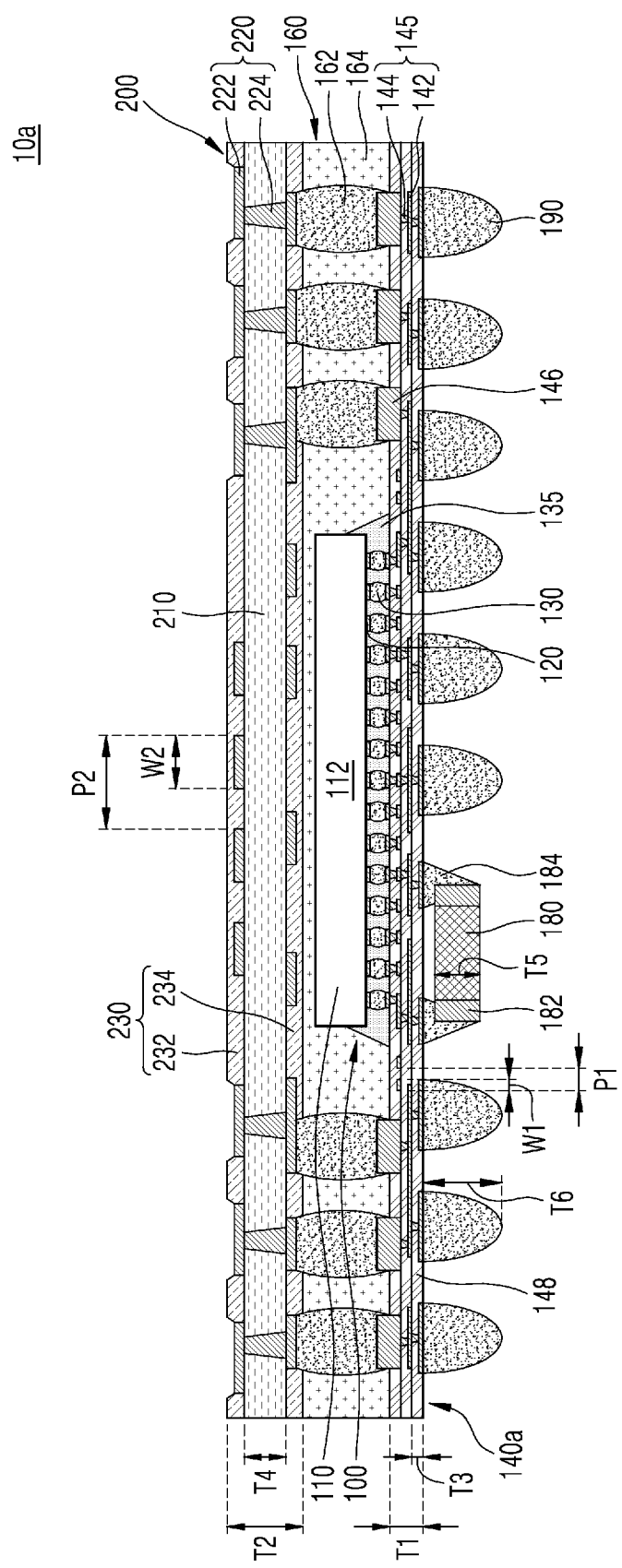
FIGS. 2 to 5 are cross-sectional views of semiconductor packages, according to example embodiments of the inventive concept.

FIG. 2 is cross-sectional view of a semiconductor package, according to example embodiments of the inventive concept. In FIG. 2, the same member numbers as in FIGS. 1A and 1B indicate the same components, and redundant descriptions may be omitted.

Referring to FIG. 2, a semiconductor package 10a may include a redistribution layer 140a, the expanded layer 160 arranged on the redistribution layer 140a, at least one semiconductor chip 100 arranged in the expanded layer 160, and the cover wiring layer 200 arranged on the expanded layer 160.

The redistribution layer 140a may include the redistribution conductive structure 145 and the plurality of redistribution insulating layers 148. The redistribution conductive structure 145 may include the plurality of redistribution line patterns 142 and the plurality of redistribution vias 144. The redistribution layer 140a may further include a plurality of conductive pillars 146. An upper surfaces of the plurality of conductive pillars 146 may be positioned at a higher level than the upper surfaces of the redistribution line patterns 142 arranged on the uppermost wiring layer among the plurality of redistribution line patterns 142. A thickness of each of the plurality of conductive pillars 146 may be greater than the thickness of each of the plurality of redistribution line patterns 142. The thickness of each of the plurality of conductive pillars 146 may be greater than the thickness T3 of each of the plurality of redistribution insulating layers 148. In some embodiments, the plurality of conductive pillars 146 may include the same material as the plurality of redistribution line patterns 142. For example, the plurality of conductive pillars 146 may include copper (Cu) or alloy of copper.

In some embodiments, the plurality of conductive pillars 146 may be formed in the same or similar way as the plurality of redistribution line patterns 142. For example, the plurality of conductive pillars 146 may be formed by performing electroless plating. In some embodiments, prior to forming the plurality of conductive pillars 146, physical vapor deposition may be performed to first form a pillar seed layer similar to the redistribution seed layer described in FIG. 1, and then electroless plating may be performed to form the plurality of conductive pillars 146 by using the pillar seed layer as seed.

A plurality of connection structures 162 may be arranged on the plurality of conductive pillars 146. The upper and lower ends of each of the plurality of connection structures 162 may be in contact with any one of the plurality of wiring patterns 222 of the cover wiring layer 200 and any one of the plurality of conductive pillars 146 of the redistribution layer 140a, respectively. In some embodiments, each of the plurality of conductive pillars 146 may be attached on any one of the plurality of redistribution vias 144. In some other embodiments, each of the plurality of conductive pillars 146 may be attached on any one of the plurality of redistribution line patterns 142.

Since the plurality of connection structures 162 may be attached to the plurality of conductive pillars 146 having a relatively thick thickness, even if the plurality of connection structures 162 are attached to the redistribution layer 140a having a relatively thin thickness, the semiconductor package 10a according to the inventive concept may have structural reliability.

Figure 3:
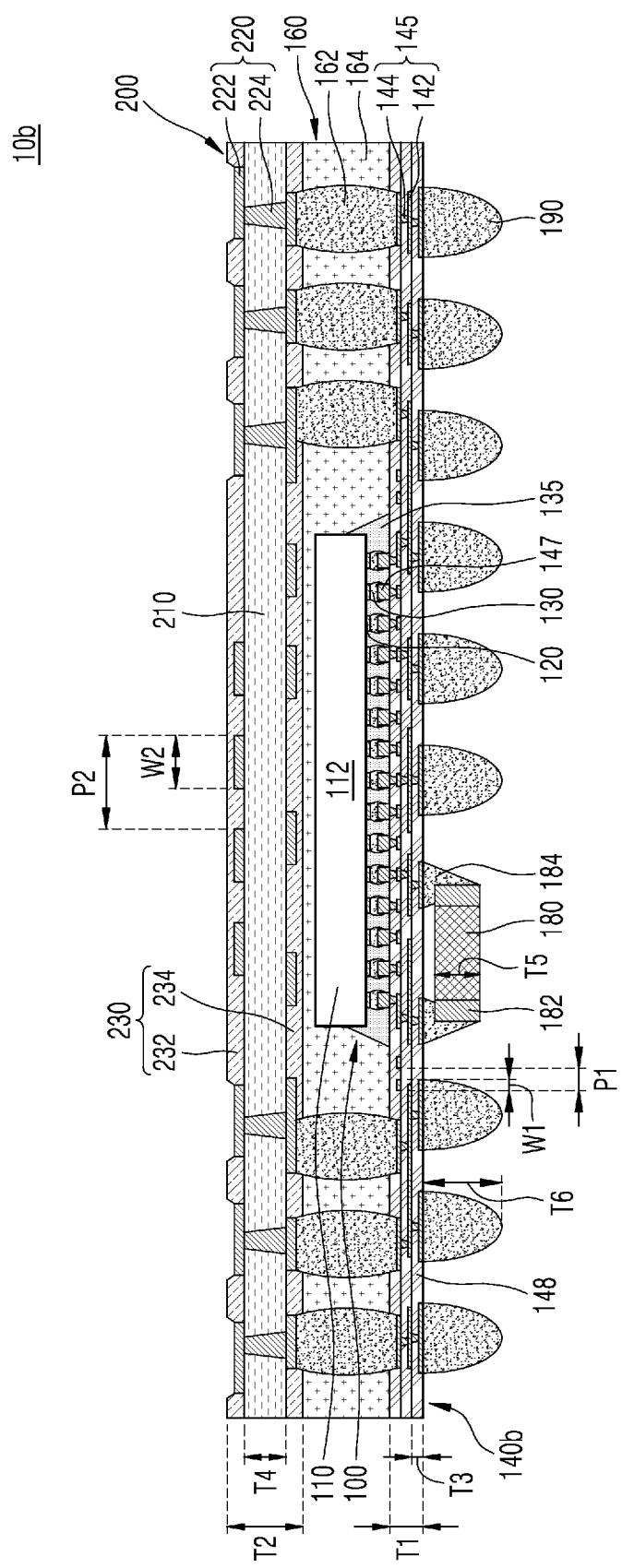

FIG. 3 is cross-sectional view of a semiconductor package, according to example embodiments of the inventive concept. In FIG. 3, the same member numbers as in FIGS. 1A and 1B indicate the same components, and redundant descriptions may be omitted.

Referring to FIG. 3, a semiconductor package 10b may include a redistribution layer 140b, the expanded layer 160 arranged on the redistribution layer 140b, at least one semiconductor chip 100 arranged in the expanded layer 160, and the cover wiring layer 200 arranged on the expanded layer 160.

The redistribution layer 140b may include the redistribution conductive structure 145 and the plurality of redistribution insulating layers 148. The redistribution conductive structure 145 may include the plurality of redistribution line patterns 142 and the plurality of redistribution vias 144. The redistribution layer 140b may further include a plurality of conductive chip pillars 147. An upper surfaces of the plurality of conductive chip pillars 147 may be arranged at a higher level than the upper surfaces of the redistribution line patterns 142 arranged on the uppermost wiring layer among the plurality of redistribution line patterns 142. A thickness of each of the plurality of conductive chip pillars 147 may be greater than the thickness of each of the plurality of redistribution line patterns 142. In some embodiments, the plurality of conductive chip pillars 147 may include the same material as the plurality of redistribution line patterns 142. For example, the plurality of conductive chip pillars 147 may include copper or alloy of copper.

In some embodiments, the plurality of conductive chip pillars 147 may be formed in the same or similar way as the plurality of redistribution line patterns 142. For example, the plurality of conductive chip pillars 147 may be formed by performing electroless plating.

At least one semiconductor chip 100 may be arranged on the plurality of conductive chip pillars 147. The plurality of chip connection pads 120 of the semiconductor chip 100 that are electrically connected to the semiconductor device 112 may be electrically connected to the redistribution conductive structure 145. The plurality of chip connection terminals 130 may be arranged between some of the plurality of redistribution line patterns 142 or some of the plurality of redistribution vias 144 and the plurality of chip connection pads 120 to electrically connect the at least one semiconductor 100 to the redistribution layer 140a. In some embodiments, each of the plurality of conductive chip pillars 147 may be attached on any one of the plurality of redistribution vias 144. In some other embodiments, each of the plurality of conductive chip pillars 147 may be attached on any one of the plurality of redistribution line patterns 142.

Since the at least one semiconductor chip 100 may be attached to the plurality of conductive chip pillars 147 having a relatively thick thickness, even if the at least one semiconductor chip 100 is attached to the redistribution layer 140a having a relatively thin thickness, the semiconductor package 10b according to the inventive concept may have structural reliability and reliability of electrical connection.

Although not separately illustrated, a semiconductor package including both the plurality of conductive pillars 146 of the semiconductor package 10a shown in FIG. 2 and the plurality of conductive chip pillars 147 of the semiconductor package 10b shown in FIG. 3 may also be provided.

Figure 4:
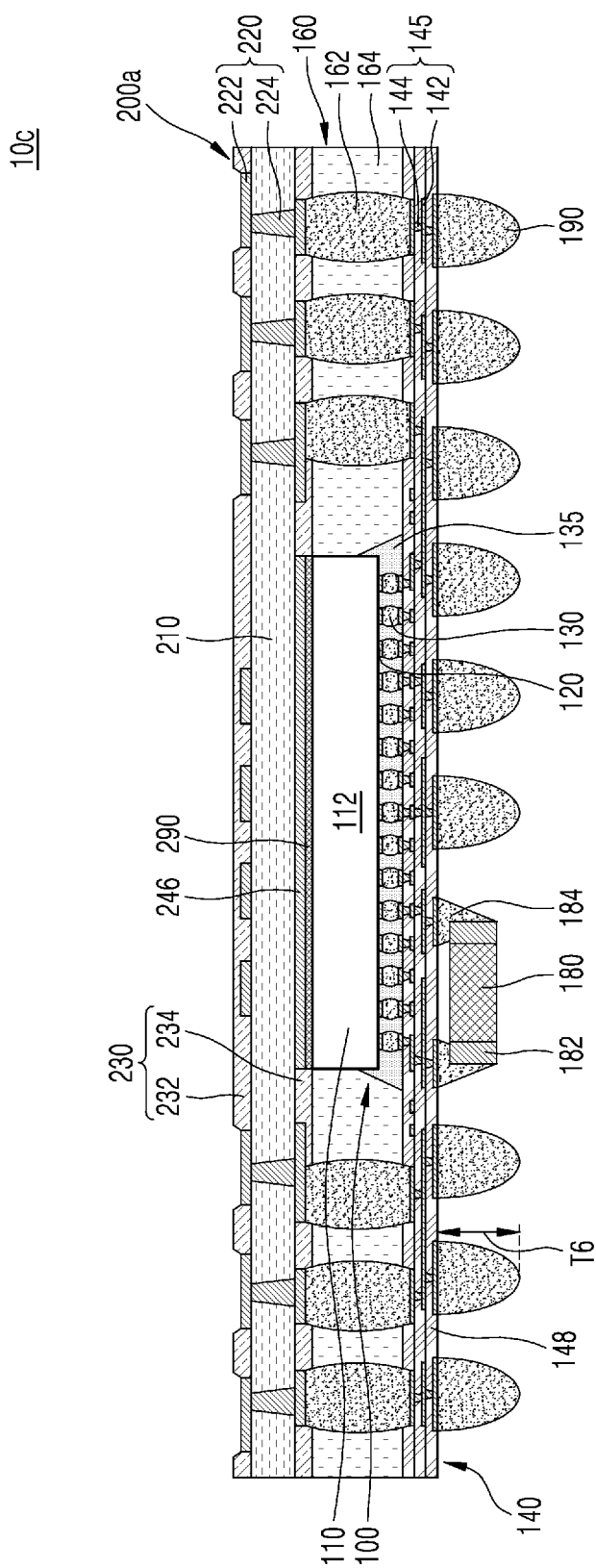

FIG. 4 is cross-sectional view of a semiconductor package according to example embodiments of the inventive concept. In FIG. 4, the same member numbers as in FIGS. 1A and 1B indicate the same components, and redundant descriptions may be omitted.

Referring to FIG. 4, a semiconductor package 10c may include the redistribution layer 140, the expanded layer 160 arranged on the redistribution layer 140, at least one semiconductor chip 100 arranged in the expanded layer 160, and a cover wiring layer 200a arranged on the expanded layer 160. The filling portion 164 may cover the side surface of the at least one semiconductor chip 100, but may not cover the inactive surface thereof. For example, an upper surface of the filling portion 164 may be at the same level as the inactive surface of the at least one semiconductor chip 100, or the upper surface of the filling portion 164 may be at a lower level as the inactive surface of the at least one semiconductor chip 100.

The cover wiring layer 200a may include at least one base insulating layer 210 and a wiring structure 220. The wiring structure 220 may include the plurality of wiring patterns 222 and the plurality of conductive vias 224. The cover wiring layer 200a may further include at least one conductive plate 246. In FIG. 4, at least one conductive plate 246 is illustrated as being arranged on a lowermost wiring layer of the cover wiring layer 200a, but is not limited thereto. The at least one conductive plate 246 may be arranged in any wiring layer, except an uppermost wiring layer among the wiring layers of the cover wiring layer 200a. For example, when the cover wiring layer 200a has three wiring layers, the at least one conductive plate 246 may be arranged on the lowermost wiring layer or a middle wiring layer, except the uppermost wiring layer.

In some embodiments, the at least one conductive plate 246 may include the same material as the plurality of wiring patterns 222. In some embodiments, the at least one conductive plate 246 may be formed in the same or similar way as the plurality of wiring patterns 222. For example, the at least one conductive plate 246 may be formed together with at least a portion of the plurality of wiring patterns 222. In some embodiments, the at least one conductive plate 246 may be provided with a ground (GND). For example, the at least one conductive plate 246 may be electrically connected to the wiring pattern 222 provided with the ground among the plurality of wiring patterns 222.

The solder resist layer 230 may include the upper surface solder resist layer 232 and the lower surface solder resist layer 234. The at least one conductive plate 246 may be exposed without being covered by the lower surface of the solder resist layer 234.

A thermal interface material (TIM) 290 may be interposed between the at least one conductive plate 246 and the inactive surface of the at least one semiconductor chip 100. The thermal interface material (TIM) 290 may include a paste or a film.

In the semiconductor package 10c according to the inventive concept, since the heat generated from the at least one semiconductor chip 100 may be discharged to the outside of the semiconductor package 10c through the at least one conductive plate 246, and thus operation reliability may be improved.

Figure 5:
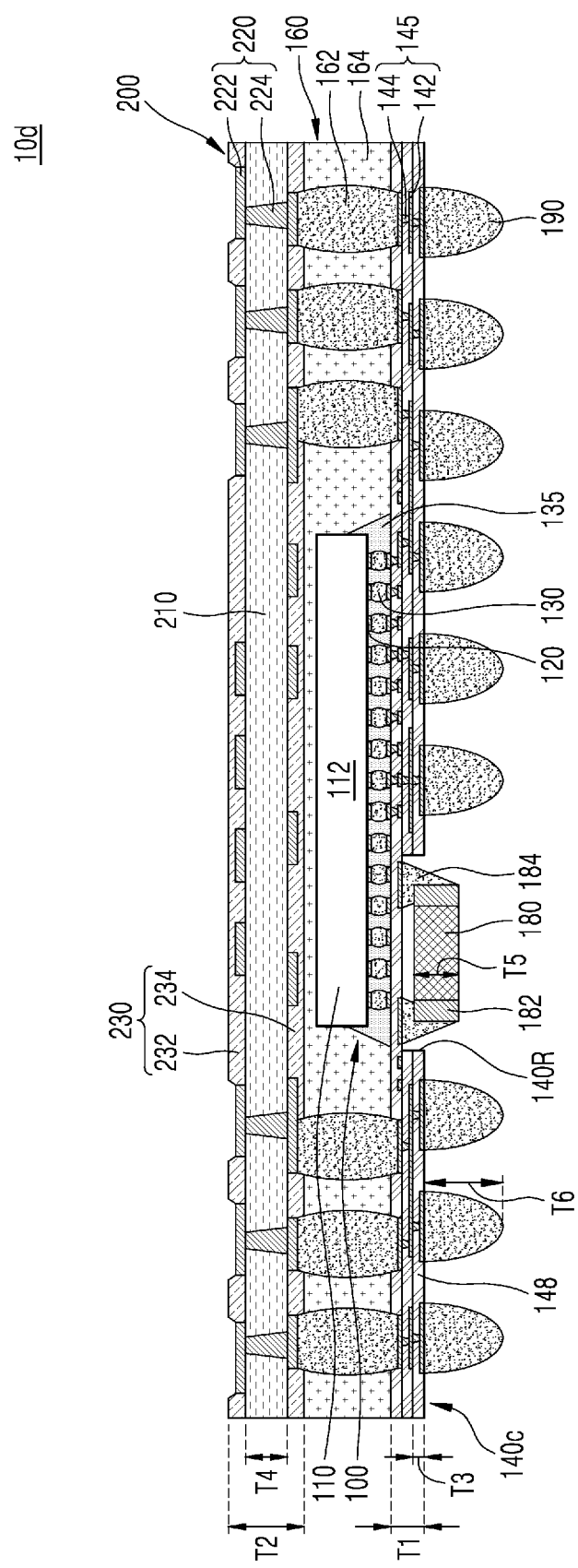

FIG. 5 is cross-sectional view of a semiconductor package according to example embodiments of the inventive concept. In FIG. 5, the same member numbers as in FIGS. 1A and 1B indicate the same components, and redundant descriptions may be omitted.

Referring to FIG. 5, a semiconductor package 10d may include the redistribution layer 140a, the expanded layer 160 arranged on the redistribution layer 140a, at least one semiconductor chip 100 arranged in the expanded layer 160, and the cover wiring layer 200 arranged on the expanded layer 160.

The redistribution layer 140c may include the redistribution conductive structure 145 and the plurality of redistribution insulating layers 148. The redistribution conductive structure 145 may include the plurality of redistribution line patterns 142 and the plurality of redistribution vias 144.

The redistribution layer 140c may include a device mounting space 140R extending into the redistribution layer 140c, in which the device mounting space 140R is formed by removing a portion of at least one redistribution insulating layer 148 of the plurality of redistribution insulating layers 148 from the lower surface thereof. FIG. 5 shows that the device mounting space 140R is formed by removing portions of two redistribution insulating layers 148 among the plurality of redistribution insulating layers 148 included in the redistribution layer 140c, but is not limited thereto. The device mounting space 140R may be formed by removing the portion of the redistribution insulating layer 148 that is at least one less than the number of the redistribution insulating layers 148 included in the redistribution layer 140c. For example, when the redistribution layer 140c includes three redistribution insulating layers 148, the device mounting space 140R may be formed by removing the portion of one redistribution insulating layer 148 from the lower surface of the redistribution layer 140c, or may be formed by removing the portions of two redistribution insulating layers 148.

At least one passive device 180 may be arranged in the device mounting space 140R of the redistribution layer 140c. Since the at least one passive device 180 has the fifth thickness T5 that is greater than the first thickness T1, which is the thickness of the redistribution layer 140c, the at least one passive device 180 may be protruded to the outside from the lower surface of the redistribution layer 140c. In some embodiments, the sixth thickness T6 may be less than the fifth thickness T5.

Since the portion of the at least one passive device 180 may be arranged in the device mounting space 140R of the redistribution layer 140c, the sixth thickness T6 of each of the plurality of external connection terminals 190 may be relatively small, and thus the overall thickness of the semiconductor package 10d may be relatively thin.

Figure 6A:
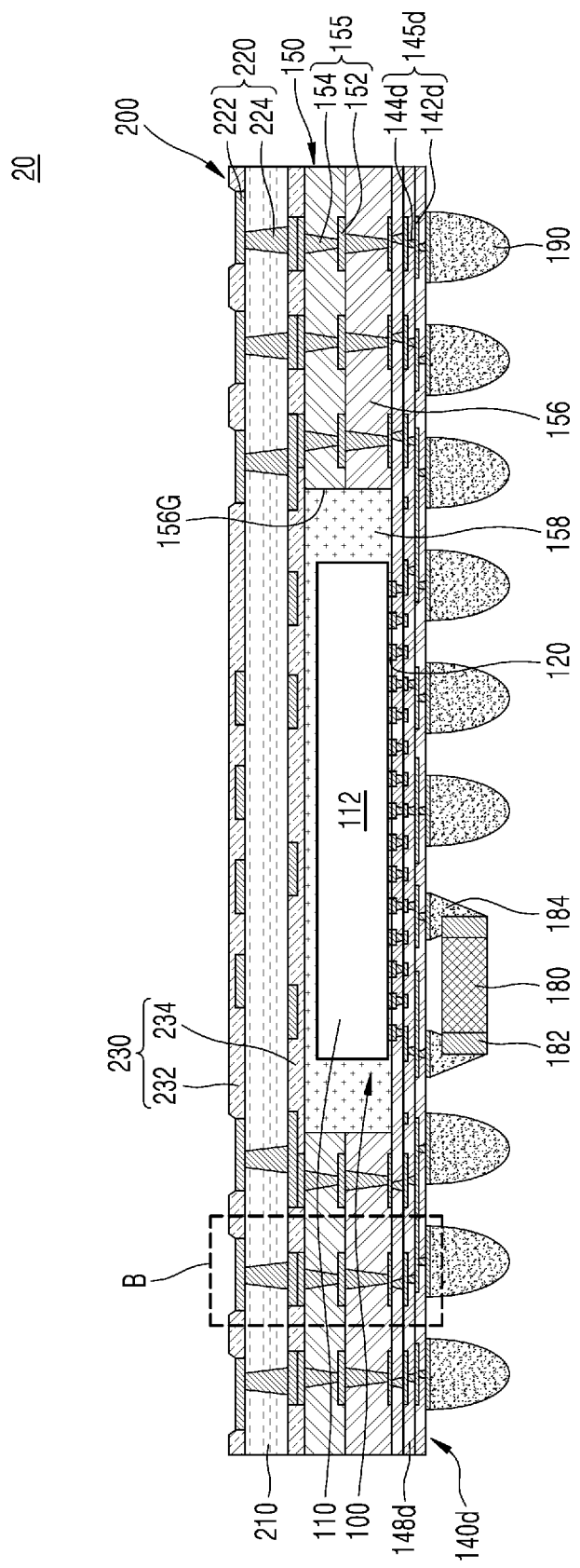
FIG. 6A is a cross-sectional view of a semiconductor package according to example embodiments of the inventive concept.
Figure 6B:
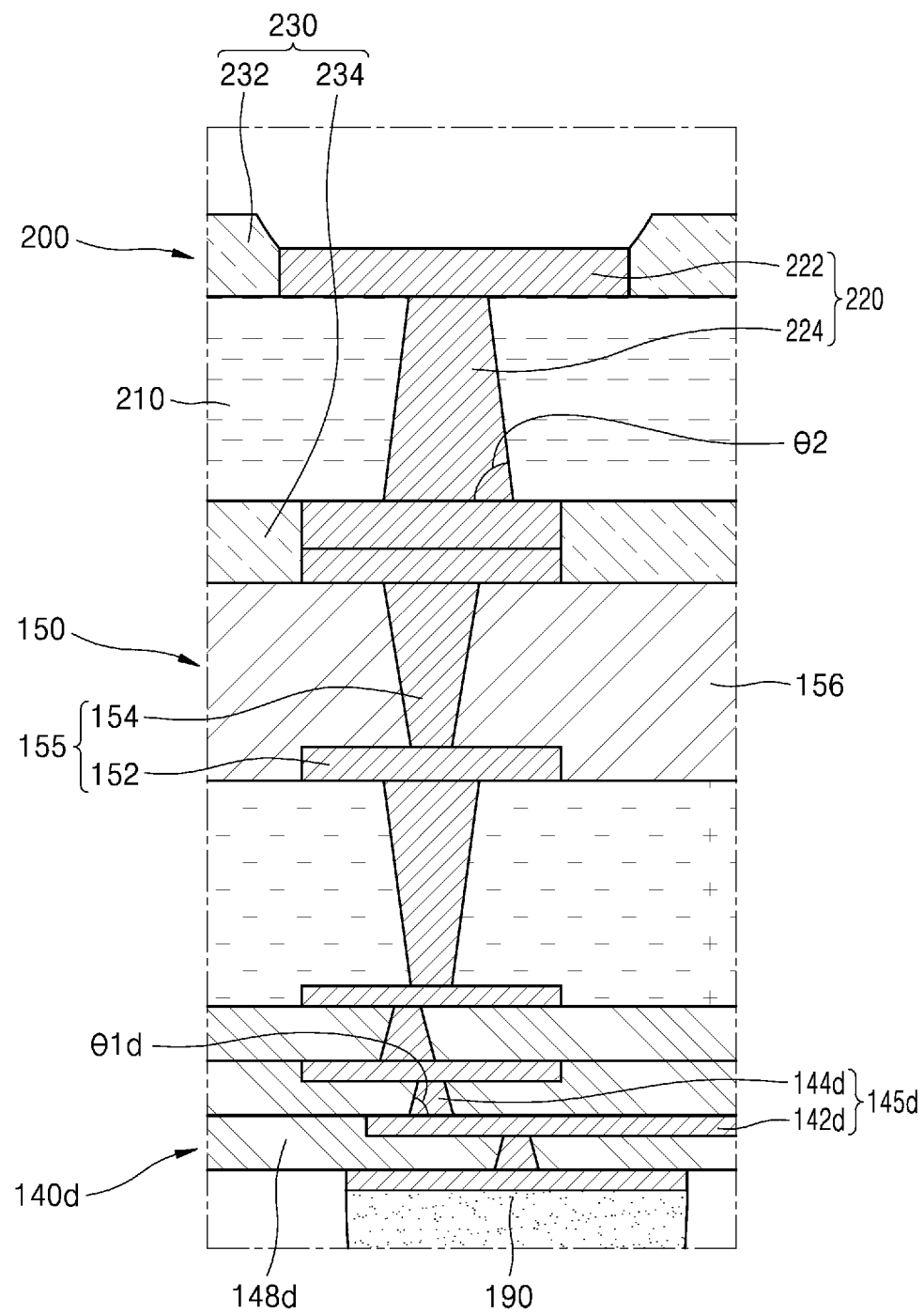
FIG. 6B is an enlarged cross-sectional view of a portion of the semiconductor package of FIG. 6A, according to example embodiments of the inventive concept.

FIG. 6A is a cross-sectional view of a semiconductor package, according to example embodiments of the inventive concept, and FIG. 6B is an enlarged cross-sectional view of a portion of the semiconductor package, according to example embodiments of the inventive concept, specifically, an enlarged cross-sectional view of portion B of FIG. 6A. In FIGS. 6A and 6B, the same member numbers as in FIGS. 1A and 1B indicate the same components, and redundant descriptions may be omitted.

Referring to FIGS. 6A and 6B together, a semiconductor package 20 may include a redistribution layer 140d, an expanded layer 150 having a mounting space 156G arranged on the redistribution layer 140d, and at least one semiconductor chip 100 arranged in the mounting space 156G, and the cover wiring layer 200 arranged on the expanded layer 150. The expanded layer 150 may surround the at least one semiconductor chip 100.

The semiconductor package 20 may include a fan out semiconductor package. In some embodiments, the expanded layer 150 may include a panel board, and the semiconductor package 20 may include a fan out panel level package (FOPLP). For example, the semiconductor package 20 may be formed by forming the redistribution layer 140d on the expanded layer 150 and then attaching the cover wiring layer 200 on the expanded layer 150.

In some embodiments, the horizontal width and horizontal area of the mounting space 156G may be greater than the horizontal width and horizontal area of the footprint constituted by the at least one semiconductor chip 100. The side surface of the at least one semiconductor chip 100 may be spaced apart from an inner surface of the mounting space 156G.

The redistribution layer 140d and the cover wiring layer 200 may be respectively referred to as the lower wiring structure and the upper wiring structure. For example, the semiconductor package 20 may include the expanded layer 150 in which the at least one semiconductor chip 100 is arranged, and the lower wiring structure and the upper wiring structure respectively covering lower and upper surfaces of the expanded layer 150.

The redistribution layer 140d may include the redistribution conductive structure 145d and the plurality of redistribution insulating layers 148d. The redistribution conductive structure 145d may include a plurality of redistribution line patterns 142d that are arranged on at least one of upper and lower surfaces of each of a plurality of redistribution insulating layers 148d, and a plurality of redistribution vias 144d penetrating at least one redistribution insulating layer 148d among the plurality of the redistribution insulating layer 148d and respectively contacting and connecting to a portion of the plurality of redistribution line patterns 142d. At least some of the plurality of redistribution line patterns 142d may be formed together with some of the plurality of redistribution vias 144d to be one body. Each of the plurality of redistribution insulating layers 148d may have a third thickness T3, and the third thickness T3 may be about 5 μm to about 20 μm.

In some embodiments, the plurality of redistribution vias 144d may include the tapered shape in which the horizontal width thereof is narrowed from the lower side to the upper side. For example, the plurality of redistribution vias 144d may be widened in width as they move away from the semiconductor chip 100.

The plurality of chip connection pads 120 of the semiconductor chip 100 may be electrically connected to the redistribution conductive structure 145d. In some embodiments, a portion of the redistribution line pattern 142d arranged on the uppermost wiring layer among the plurality of redistribution line patterns 142d may contact the plurality of chip connection pads 120, but is not limited thereto. In some other embodiments, a portion of the uppermost redistribution vias 144d among the plurality of redistribution vias 144d may contact the plurality of chip connection pads 120.

The expanded layer 150 may include, for example, the printed circuit board, the ceramic substrate, the wafer for package manufacturing, or the interposer. In some embodiments, the expanded layer 150 may include the multi-layer printed circuit board. The mounting space 156G may be formed as an opening or a cavity in the expanded layer 150. The mounting space 156G may be formed in a portion of the expanded layer 150, for example, in a central region. The mounting space 156G may be formed by being recessed or opened from the upper surface of the expanded layer 150 to a predetermined depth. The mounting space 156G may have a width that is greater than that of the at least one semiconductor chip 100. In order to recess or open the expanded layer 150, a process such as dry etching, wet etching, screen printing, drill bit, or laser drilling may be used.

The expanded layer 150 may include a connection structure 155 and at least one substrate base 156. The connection structure 155 may include a connection wiring pattern 152 and a connection conductive via 154. Each of the connection wiring pattern 152, the connection conductive via 154, and the substrate base 156 of the expanded layer 150 may respectively include a material substantially the same as each of the wiring pattern 222, the conductive via 224, and the base insulating layer 210 of the cover wiring layer 200, and also may be respectively formed similarly to each other, so a detailed description thereof will be omitted.

The semiconductor package 20 may further include a filling insulating layer 158 filling a space between the semiconductor chip 100 and the expanded layer 150. For example, the filling insulating layer 158 may include thermosetting resin such as epoxy resin, thermoplastic resin such as polyimide, or resin containing reinforcing material such as an inorganic filler in these resins, specifically Ajinomoto build-up film (ABF), FR-4, BT, and the like. Alternatively, the filling insulating layer 158 may include molding material such as EMC or photosensitive material such as photoimagable encapsulant (PIE).

In some embodiments, the filling insulating layer 158 may be formed by depositing silicon oxide with a predetermined thickness, and then filling a portion of the mounting space 156G that is not filled with silicon oxide with polymer such as polyimide.

In some other embodiments, the filling insulating layer 158 may be formed such that the polymer such as polyimide is formed such that the inactive surface of the semiconductor chip 100 is exposed to the outside (e.g., not covered by the filling insulating layer 158), and then an insulating material covers the inactive surface of the semiconductor chip 100. The insulating material may include, for example, a silicon oxide film, a silicon nitride film, or a silicon oxynitride film.

On the expanded layer 150, the cover wiring layer 200 including the wiring structure 220 that is electrically connected to the connection structure 155 may be arranged.

The semiconductor package 20 may be formed by forming the redistribution layer 140d on the expanded layer 150 and then attaching the cover wiring layer 200 on the expanded layer 150.

Since the redistribution layer 140d may be formed on the expanded layer 150, each of the plurality of redistribution vias 144d may include the tapered shape, in which the horizontal width thereof is narrowed and extended from the lower side to the upper side. For example, each of the plurality of redistribution vias 144d may be widened in width as it moves away from the semiconductor chip 100.

A first angle θ1d, which is a base angle of each of the plurality of redistribution vias 144d, may be less than a second angle θ2, which is the base angle of each of the plurality of conductive vias 224. In some embodiments, the first angle θ1d may be between about 60° and about 75°, and the second angle θ2 may be between about 80° and about 90°.

Figure 7:
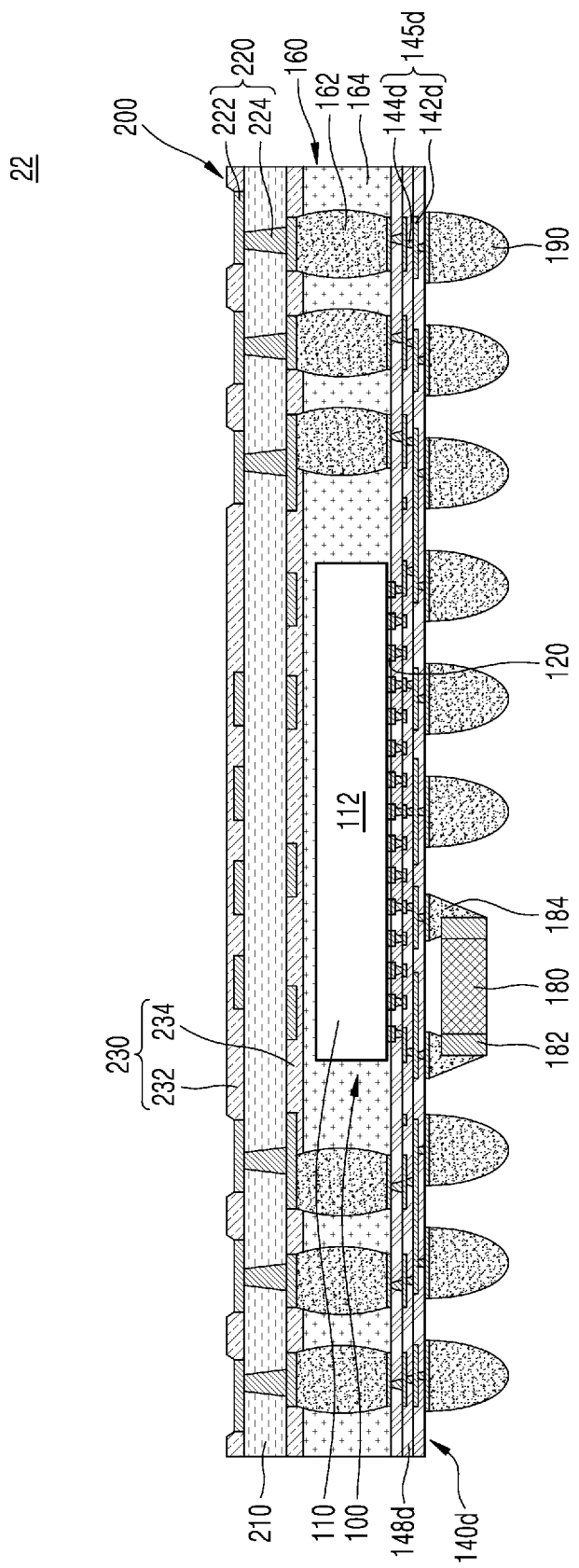
FIGS. 7 to 10 are cross-sectional views of semiconductor packages, according to example embodiments of the inventive concept.

FIG. 7 is cross-sectional view of a semiconductor package, according to example embodiments of the inventive concept. In FIG. 7, the same member numbers as in FIGS. 1A, 1B, 6A, and 6B indicate the same components, and redundant descriptions may be omitted.

Referring to FIG. 7, a semiconductor package 22 may include a redistribution layer 140d, the expanded layer 160 arranged on the redistribution layer 140d, at least one semiconductor chip 100 arranged in the expanded layer 160, and the cover wiring layer 200 arranged on the expanded layer 160.

The at least one semiconductor chip 100, the expanded layer 160, and the cover wiring layer 200 of the semiconductor package 22 shown in FIG. 7 may be substantially the same as the at least one semiconductor chip 100, the expanded layer 160, and the cover wiring layer 200 of the semiconductor package 10 shown in FIGS. 1A and 1B, and the redistribution layer 140d of the semiconductor package 22 may be substantially the same as the redistribution layer 140d of the semiconductor package 20 shown in FIGS. 6A and 6B, and therefore, a detailed description thereof will be omitted.

The semiconductor package 22 may include a chip first fan out semiconductor package, in which the expanded layer 160 surrounding the at least one semiconductor chip 100 is first formed and then the redistribution layer 140d is formed. In some embodiments, the semiconductor package 22 may include a chip first fan out wafer level package (Chip First FOWLP).

Figure 8:
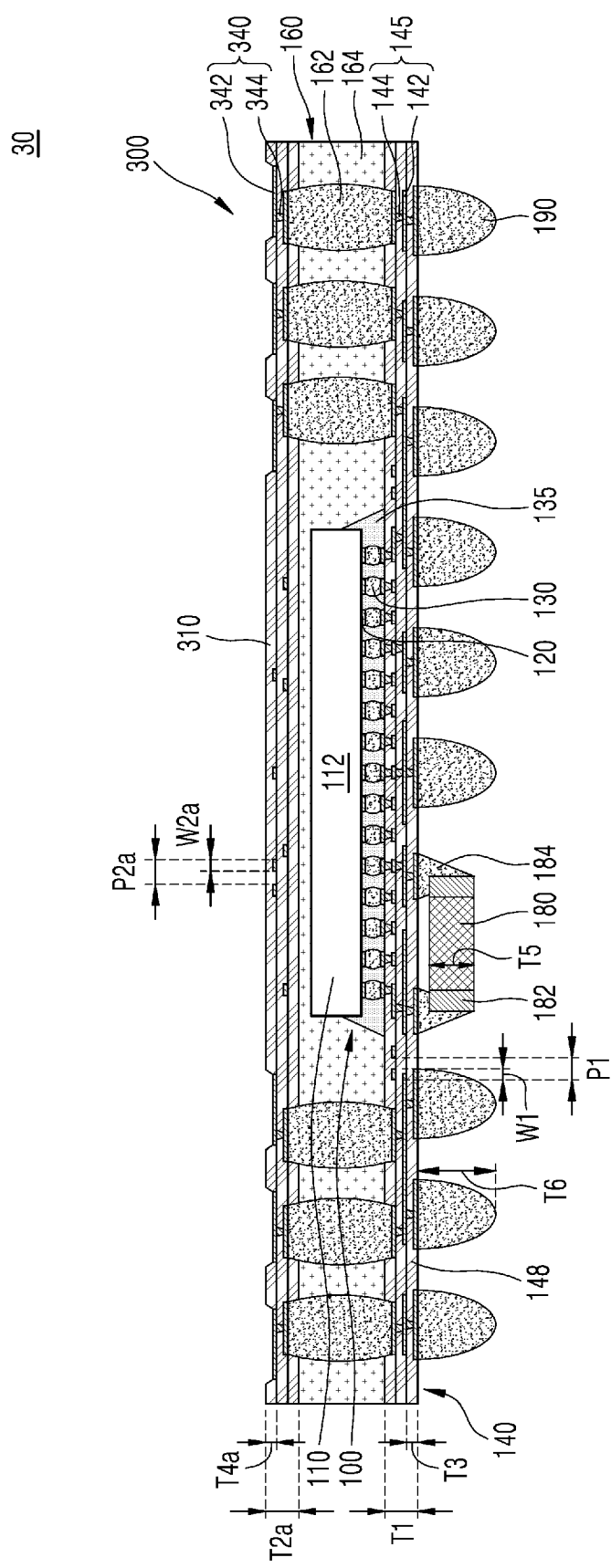

FIG. 8 is cross-sectional view of a semiconductor package according to example embodiments of the inventive concept. In FIG. 8, the same member numbers as in FIGS. 1A to 7 indicate the same components, and redundant descriptions may be omitted.

Referring to FIG. 8, a semiconductor package 30 may include the redistribution layer 140, the expanded layer 160 arranged on the redistribution layer 140, at least one semiconductor chip 100 arranged in the expanded layer 160, and a cover wiring layer 300 arranged on the expanded layer 160.

The at least one semiconductor chip 100, the redistribution layer 140, and the expanded layer 160 of the semiconductor package 30 may be substantially the same as the at least one semiconductor chip 100, the redistribution layer 140, and the expanded layer 160 of the semiconductor package 10 shown in FIGS. 1A and 1B, and therefore, detailed description thereof will be omitted.

The cover wiring layer 300 may include at least one base insulating layer 310 and a wiring structure 340. The wiring structure 340 may include a plurality of wiring patterns 342 and a plurality of conductive vias 344, wherein the plurality of wiring patterns 342 may be arranged on at least one of an upper surface and a lower surface of the at least one base insulating layer 310, and the plurality of conductive vias 344 may penetrate the at least one base insulating layer 310 to be respectively connected to a portion of the plurality of wiring patterns 342.

In the semiconductor package 10 shown in FIGS. 1A and 1B, the separately formed cover wiring layer 200 may be attached on the expanded layer 160, but in the semiconductor package 30 in FIG. 8, the cover wiring layer 300 may be formed on the expanded layer 160 through a method similar to a method of forming the redistribution layer 140.

Accordingly, each of the base insulating layer 310, the wiring pattern 342, and the conductive via 344 of the cover wiring layer 300 may respectively include a material substantially the same as each of the redistribution insulating layer 148, the redistribution line pattern 142, and the redistribution vias 144 of the redistribution layer 140, and also may be respectively formed similarly to each other, so a detailed description thereof will be omitted.

The number of wiring layers of the redistribution layer 140 may be greater than the number of wiring layers of the cover wiring layer 300.

The first thickness T1, which is the thickness of the redistribution layer 140, may be greater than a second thickness T2a, which is a thickness of the cover wiring layer 300. For example, the first thickness T1 may be about 30 μm to about 50 μm, and the second thickness T2a may be about 20 μm to about 70 μm.

The third thickness T3, which is the thickness of one redistribution insulating layer 148 included in the redistribution layer 140, may be substantially the same as or similar to a fourth thickness T4a, which is a thickness of one base insulation layer 310 included in the cover wiring layer 300. For example, each of the third thickness T3 and the fourth thickness T4a may be about 5 μm to about 20 μm.

The width and pitch of the plurality of redistribution line patterns 142 may be substantially the same as or similar to the width and pitch of the plurality of wiring patterns 342. In some embodiments, the thicknesses of the plurality of redistribution line patterns 142 may be substantially the same as or similar to the thicknesses of the plurality of wiring patterns 342. Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

The first width W1 and the first pitch P1, which are the minimum width and the minimum pitch of the plurality of redistribution line patterns 142, may be substantially the same as or similar to a second width W2a and a second pitch P2a, which are the minimum width and the minimum pitch of the plurality of wiring patterns 342. For example, the first width W1 may be about 5 µm to about 10 µm, and the first pitch P1 may be about 10 µm to about 25 µm. For example, the second width W2a may be about 5 µm to about 10 µm, and the second pitch P2a may be about 10 µm to about 25 µm.

Further, although not separately shown, a semiconductor package may be provided with the expanded layer 150 shown in FIGS. 6A and 6B instead of the expanded layer 160 of the semiconductor package 30, or a semiconductor package may be provided with the redistribution layer 140d shown in FIG. 7 instead of the redistribution layer 140.

Since both the redistribution layer 140 and the cover wiring layer 300 may have relatively thin thickness in the semiconductor package 30 according to the inventive concept, the overall thickness of the semiconductor package 30 may be reduced. Therefore, even if the electronic device including the semiconductor package 30 is multifunctional and has a large capacity, the thickness of the semiconductor package 30 may be reduced, so that the electronic device may be miniaturized.

Figure 9:
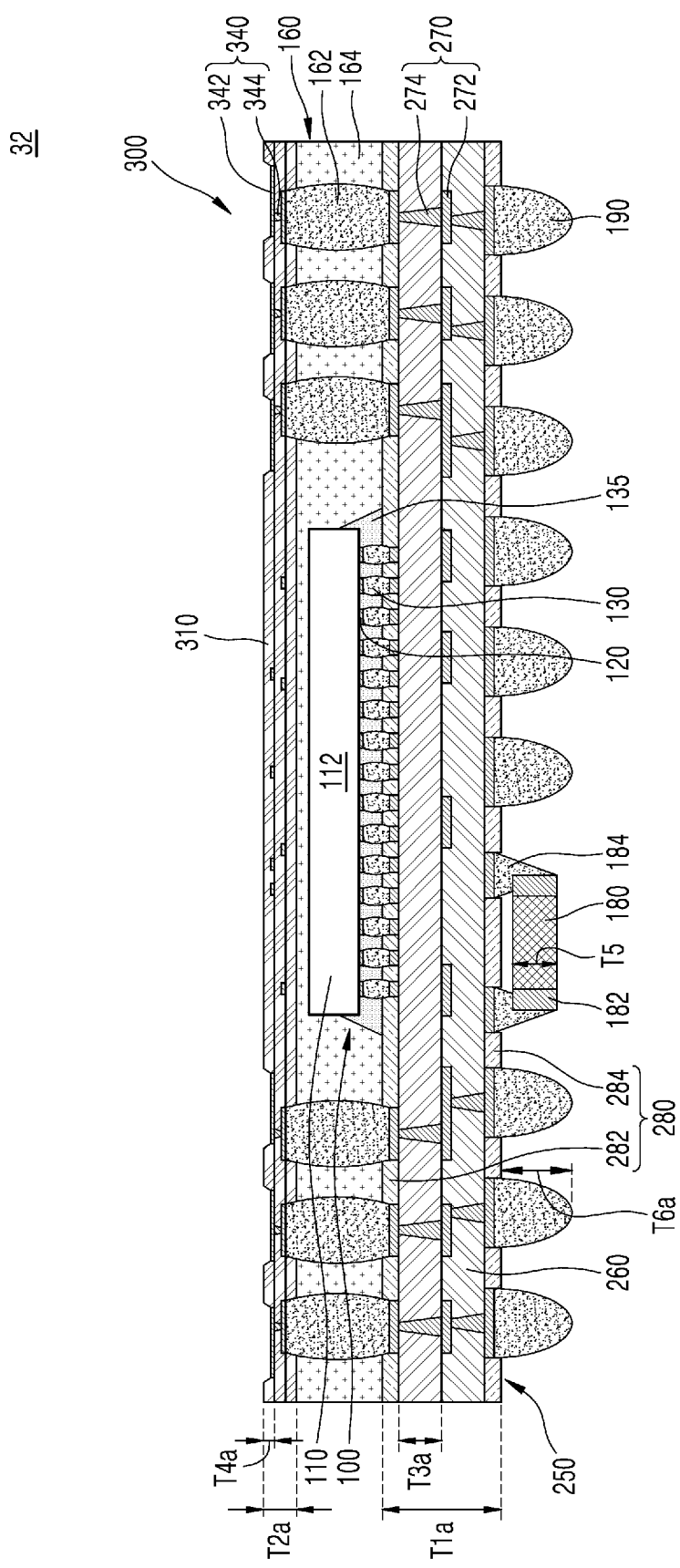

FIG. 9 is cross-sectional view of a semiconductor package according to example embodiments of the inventive concept. In FIG. 9, the same member numbers as in FIGS. 1A to 8 indicate the same components, and redundant descriptions may be omitted.

Referring to FIG. 9, the semiconductor package 32 may include a supporting wiring layer 250, the expanded layer 160 arranged on the supporting wiring layer 250, the at least one semiconductor chip 100 arranged in the expanded layer 160, and the cover wiring layer 300 arranged on the expanded layer 160.

The at least one semiconductor chip 100 and the expanded layer 160 of the semiconductor package 32 may be substantially the same as the at least one semiconductor chip 100 and the expanded layer 160 of the semiconductor package 10 shown in FIGS. 1A and 1B, and the cover wiring layer 300 of the semiconductor package 32 may be substantially the same as the cover wiring layer 300 of the semiconductor package 30 shown in FIG. 8, and a detailed description thereof will be omitted.

The supporting wiring layer 250 may include, for example, the printed circuit board, the ceramic substrate, the wafer for package manufacturing, or the interposer. In some embodiments, the supporting wiring layer 250 may include the multi-layer printed circuit board.

The supporting wiring layer 250 may include a plurality of supporting insulating layers 260 and a supporting wiring structure 270. The supporting wiring structure 270 may include a plurality of supporting wiring patterns 272 and a plurality of supporting conductive vias 274. A supporting solder resist layer 280 exposing a portion of the plurality of supporting wiring patterns 272 may be formed on the upper and lower surfaces of the plurality of supporting insulating layers 260. The supporting solder resist layer 280 may include an upper surface supporting solder resist layer 282 and a lower surface supporting solder resist layer 284. The upper surface supporting solder resist layer 282 may expose a portion of the plurality of supporting wiring patterns 272 while covering an upper surface of the plurality of the supporting insulating layers 260, and the lower surface supporting solder resist layer 284 may expose a portion of the plurality of supporting wiring patterns 272 while covering a lower surface of the plurality of the supporting insulating layers 260. For example, the upper surface supporting solder resist layer 282 may not cover upper surfaces of the plurality of supporting wiring patterns 272 provided on the upper surface of the plurality of supporting insulating layers 260, and the lower surface supporting solder resist layer 284 may not cover lower surfaces of the plurality of supporting wiring patterns 272 provided on a lower surface of the plurality of the supporting insulating layers 260. In some embodiments, the lower surface supporting solder resist layer 284 may be formed on the lower surface of the plurality of supporting insulating layers 260, but the upper surface supporting solder resist layer 282 may not be formed on the upper surface thereof.

A plurality of external connection terminals 190 electrically connected to the supporting wiring patterns 272 may be attached to the lower surface of the supporting wiring layer 250.

Each of the supporting insulating layers 260, the supporting wiring patterns 272, and the supporting conductive vias 274 may respectively include a material substantially the same as each of the base insulating layers 210, the wiring patterns 222, and the conductive vias 224 in FIGS. 1A and 1B, and also may be respectively formed similarly to each other, so a detailed description thereof will be omitted.

The semiconductor package 10 shown in FIGS. 1A and 1B may form the redistribution layer 140 on the carrier substrate, and the semiconductor package 20 shown in FIGS. 6A and 6B may form the redistribution layer 140d on the expanded layer 150. However, the semiconductor package 32 shown in FIG. 9 may form the expanded layer 160 on the separately formed supporting wiring layer 250.

The number of wiring layers of the supporting wiring layer 250 may be greater than the number of wiring layers of the cover wiring layer 300. A first thickness T1a, which is a thickness of the supporting wiring layer 250, may be greater than a second thickness T2a, which is a thickness of the cover wiring layer 300. For example, the first thickness T1a may be about 90 µm to about 150 µm, and the second thickness T2a may be about 20 µm to about 70 µm.

A third thickness T3a, which is a thickness of each of the plurality of supporting insulating layers 260 of the supporting wiring layer 250, may be greater than a fourth thickness T4a, which is a thickness of one base insulating layer 310 of the cover wiring layer 300. For example, the third thickness T3a may be about 25 µm to about 60 µm, and the fourth thickness T4a may be about 5 µm to about 20 µm.

In addition, although not separately shown, a semiconductor package may be also provided with the expanded layer 150 shown in FIGS. 6A and 6B instead of the expanded layer 160 of the semiconductor package 32.

The semiconductor package 32 according to the inventive concept may obtain the structural reliability through the supporting wiring layer 250 having a relatively thick thickness, and also the thickness of the semiconductor package 32 may be reduced through the cover wiring layer 300 having a relatively thin thickness.

Figure 10:
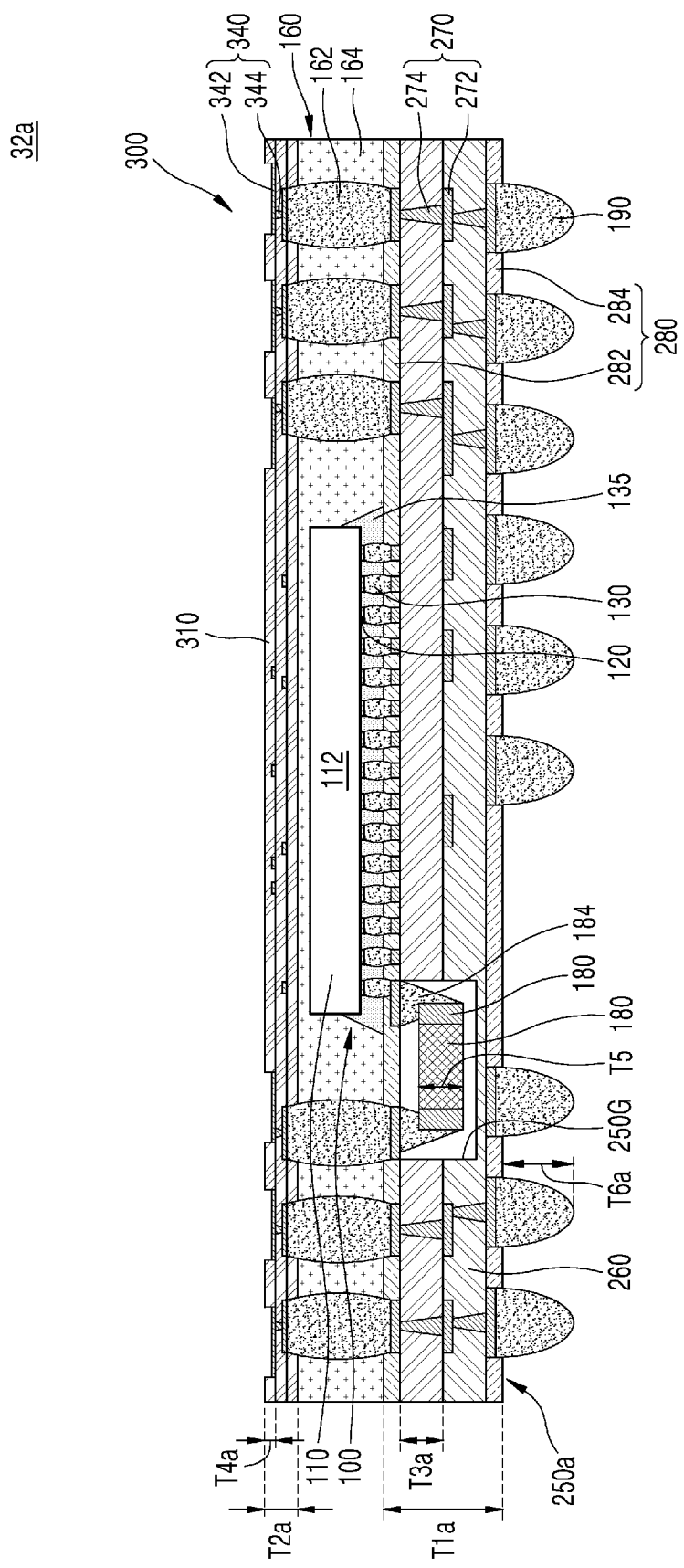

FIG. 10 is cross-sectional view of a semiconductor package according to example embodiments of the inventive concept. In FIG. 10, the same member numbers as in FIGS. 1A to 9 indicate the same components, and redundant descriptions may be omitted.

Referring to FIG. 10, the semiconductor package 32a may include a supporting wiring layer 250a, the expanded layer 160 arranged on the supporting wiring layer 250a, the at least one semiconductor chip 100 arranged in the expanded layer 160, and the cover wiring layer 300 arranged on the expanded layer 160.

The supporting wiring layer 250a may include a device mounting space 250G. The device mounting space 250G may be formed as the opening or the cavity in the supporting wiring layer 250a. The device mounting space 250G may be formed by removing a portion of the plurality of supporting insulating layers 260 included in the supporting wiring layer 250a. In FIG. 10, the device mounting space 250G is illustrated as not communicating with the outside of the semiconductor package 32a, but is not limited thereto. In some embodiments, the device mounting space 250G may be formed to extend inwardly from a lower surface of the supporting wiring layer 250a, similar to the device mounting space 140R shown in FIG. 5.

At least one passive device 180 may be arranged in the device mounting space 250G of the supporting wiring layer 250a. In some embodiments, the fifth thickness T5, which is the thickness of the at least one passive device 180, may be less than the first thickness T1a, which is the thickness of the supporting wiring layer 250a. In this case, the at least one passive device 180 may not protrude outwardly from the lower surface of the supporting wiring layer 250a, and may be embedded in the supporting wiring layer 250a.

In the semiconductor package 32a, since the at least one passive device 180 may be embedded in the supporting wiring layer 250a, a sixth thickness T6a of each of the plurality of external connection terminals 190 may be small, so the overall thickness of the semiconductor package 32a may be relatively thin.

Figure 11:
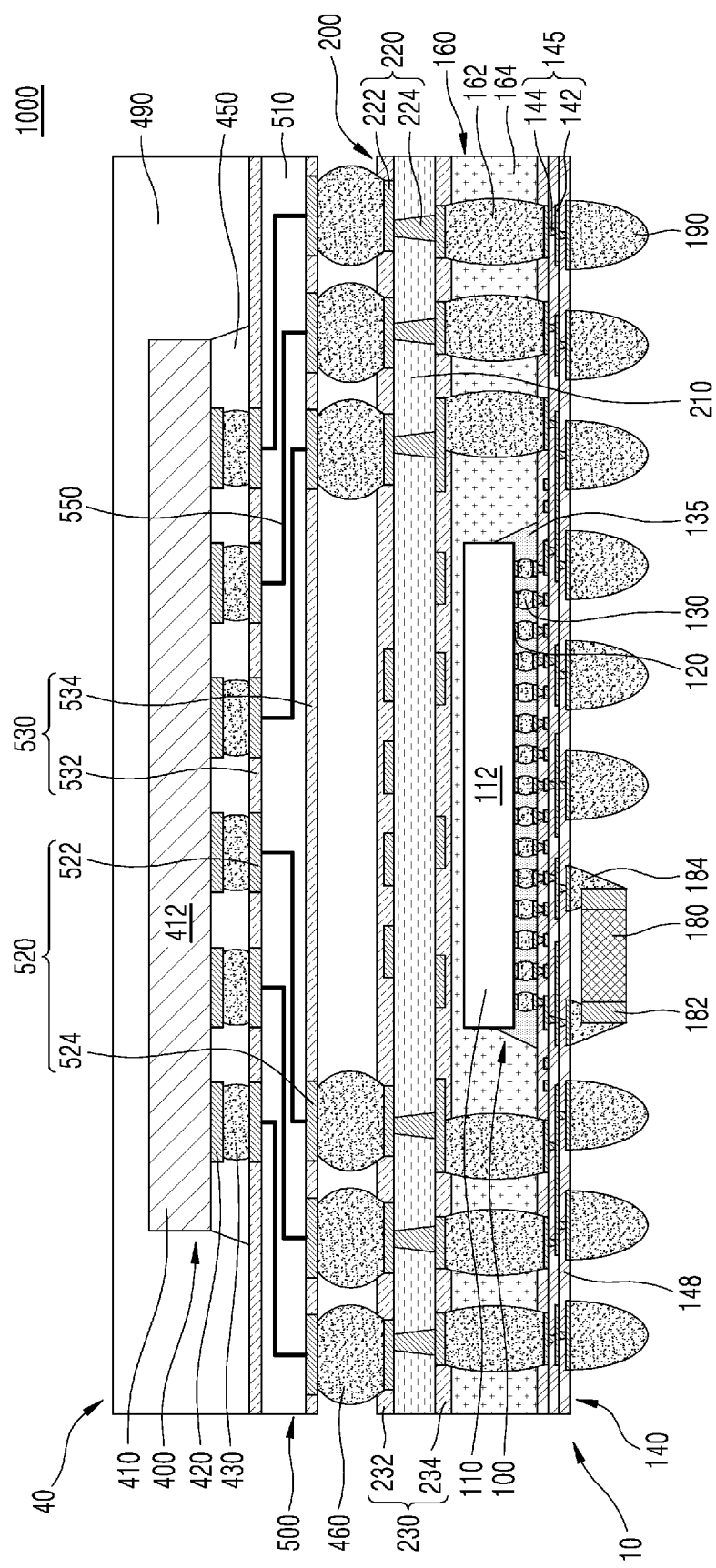
FIGS. 11 to 15 are cross-sectional views of package on packages having a semiconductor package, according to example embodiments of the inventive concept.

FIG. 11 is a cross-sectional view of a package on package having a semiconductor package, according to example embodiments of the inventive concept.

Referring to FIG. 11, the package on package 1000 may include a second semiconductor package 40 stacked on the first semiconductor package 10. The first semiconductor package 10 may be a lower semiconductor package, and the second semiconductor package 40 may be an upper semiconductor package. A first semiconductor package 10, a first semiconductor chip 100, a first semiconductor substrate 110, a first semiconductor device 112, a first chip connection pad 120, a first chip connection terminal 130, and a first underfill layer 135 may be respectively and substantially the same as the semiconductor package 10, the semiconductor chip 100, the semiconductor substrate 110, the semiconductor device 112, the chip connection pad 120, the chip connection terminal 130, and the underfill layer 135 described with reference to FIGS. 1A and 1B, and thus detailed descriptions thereof will be omitted.

The second semiconductor package 40 may include at least one second semiconductor chip 400. The second semiconductor package 40 may be electrically connected to the first semiconductor package 10 through a plurality of package connection terminals 460 that may be attached to a portion of the plurality of wiring patterns 222 of the first semiconductor package 10, in which the plurality of wiring patterns 222 are exposed without being covered by the upper surface solder resist layer 232.

The second semiconductor chip 400 may include a second semiconductor substrate 410 on which a second semiconductor device 412 may be formed on an active surface thereof, and a plurality of second chip connection pads 420 arranged on the active surface of the second semiconductor substrate 410. Each of the second semiconductor substrate 410, the second semiconductor device 412, and the second chip connection pad 420 may be substantially similar to each of the semiconductor substrate 110, the semiconductor device 112, and the chip connection pads 120 described through FIGS. 1A and 1B, and thus redundant descriptions will be omitted.

The at least one second semiconductor chip 400 may include a memory semiconductor chip. The second semiconductor chip 400 may include, for example, a DRAM chip, a SRAM chip, a flash memory chip, an EEPROM chip, a PRAM chip, an MRAM chip, or an RRAM chip.

In FIG. 11, the at least one second semiconductor chip 400 included in the second semiconductor package 40 is illustrated as being mounted on a package base substrate 500 in a flip chip manner, but is not limited thereto. The package on package 1000 may include all types of semiconductor package including the at least one second semiconductor chip 400 and the package connection terminal 460 formed on a lower side in order to be electrically connected to the first semiconductor package 10, as an upper semiconductor package.

The package base substrate 500 may include a base board layer 510 and a plurality of board pads 520 to be arranged on upper and lower surfaces of the base board layer 510. The plurality of board pads 520 may include a plurality of board upper surface pads 522 to be arranged on the upper surface of the base board layer 510 and a plurality of board lower surface pads 524 to be arranged on the lower surface thereof. In some embodiments, the package base substrate 500 may include the printed circuit board. For example, the package base substrate 500 may include the multi-layer printed circuit board. The base board layer 510 may include at least one material selected from phenol resin, epoxy resin, and polyimide.

A board solder resist layer 530 exposing the plurality of board pads 520 may be formed on the upper and lower surfaces of the base board layer 510. The board solder resist layer 530 may include an upper surface board solder resist layer 532 and a lower surface board solder resist layer 534, in which the upper surface board solder resist layer 532 may expose a plurality of board upper surface pads 522 while covering an upper surface of the base board layer 510 and the lower surface board solder resist layer 534 may expose a plurality of board lower surface pads 524 while covering a lower surface of the base board layer 510.

The package base substrate 500 may include a board wiring 550 that electrically connects the plurality of board upper surface pads 522 to the plurality of board lower surface pads 524 within the base board layer 510. The board wiring 550 may include a board wiring line and a board wiring via. The board wiring 550 may include copper, nickel, stainless steel or beryllium copper. In some embodiments, the board wiring 550 may be between the upper surface of the base board layer 510 and the upper surface board solder resist layer 532, and/or between the lower surface of the base board layer 510 and the lower surface board solder resist layer 534.

The plurality of board upper surface pads 522 may be electrically connected to the second semiconductor chip 400. For example, a plurality of second chip connection terminals 430 may be arranged between the plurality of second chip connection pads 420 of the second semiconductor chip 400 and the plurality of board upper surface pads 522 of the package base substrate 500, and thus, the second semiconductor chip 400 may be electrically connected to the package base substrate 500. In some embodiments, a second underfill layer 450 surrounding the plurality of second chip connection terminals 430 may be interposed between the second semiconductor chip 400 and the package base substrate 500. The second underfill layer 450 may include, for example, epoxy resin formed by a capillary underfill method. In some embodiments, the second underfill layer 450 may include a non-conductive film.

A molding layer 490 surrounding the second semiconductor chip 400 may be arranged on the package base substrate 500. The molding layer 490 may include, for example, epoxy mold compound (EMC). In some embodiments, the molding layer 490 may cover the inactive surface of the second semiconductor chip 400. In some other embodiments, the molding layer 490 may cover a side surface of the second semiconductor chip 400, but may not cover the inactive surface thereof, and a heat radiating member may be attached to the inactive surface of the second semiconductor chip 400.

Figure 12:
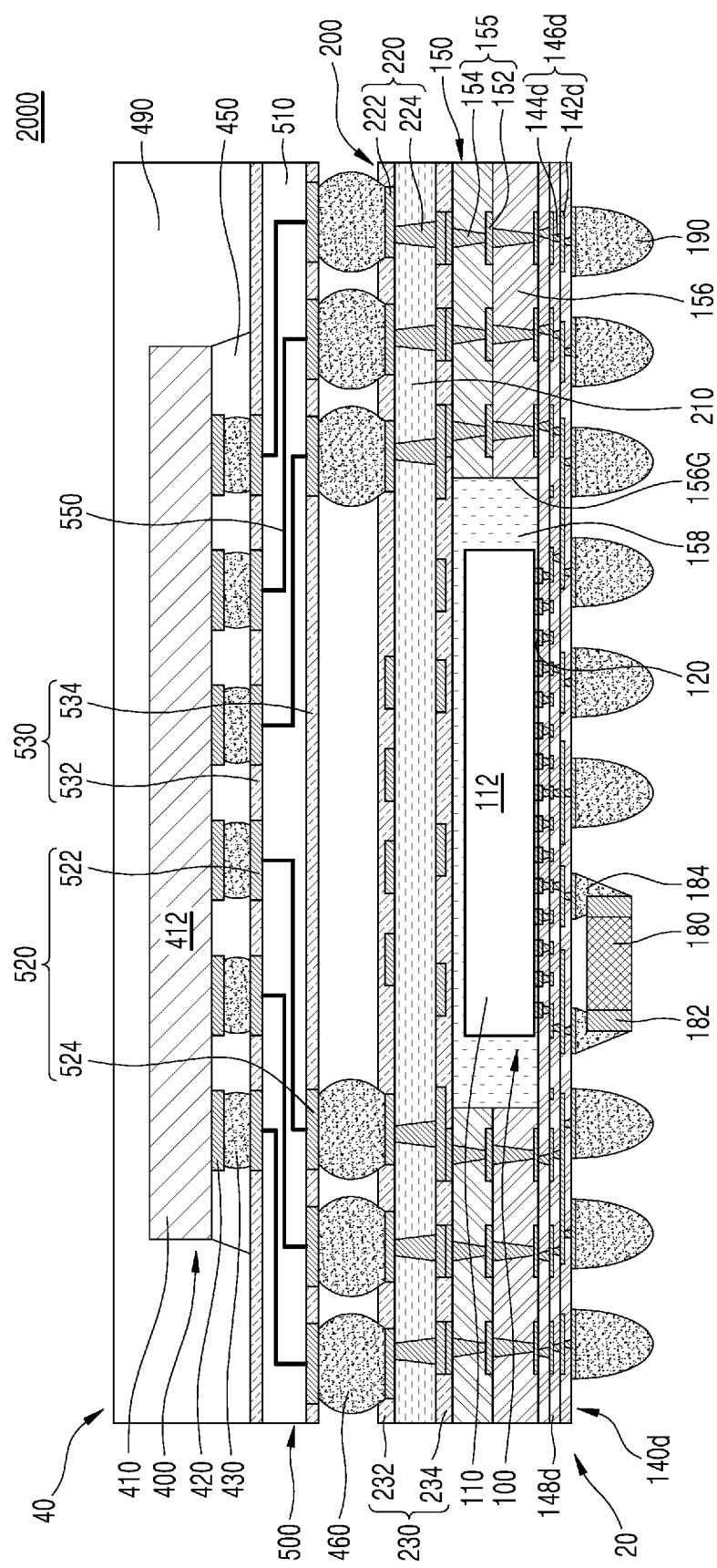

FIG. 12 is a cross-sectional view of a package on package having a semiconductor package, according to example embodiments of the inventive concept.

Referring to FIG. 12, the package on package 2000 may include the second semiconductor package 40 stacked on the first semiconductor package 20. The first semiconductor package 20 may be the lower semiconductor package, and the second semiconductor package 40 may be the upper semiconductor package. The first semiconductor package 20 may be substantially the same as the semiconductor package 20 described through FIGS. 6A and 6B, and the second semiconductor package 40 may be substantially the same as the second semiconductor package 40 described through FIG. 11, and thus detailed description thereof will be omitted.

Figure 13:
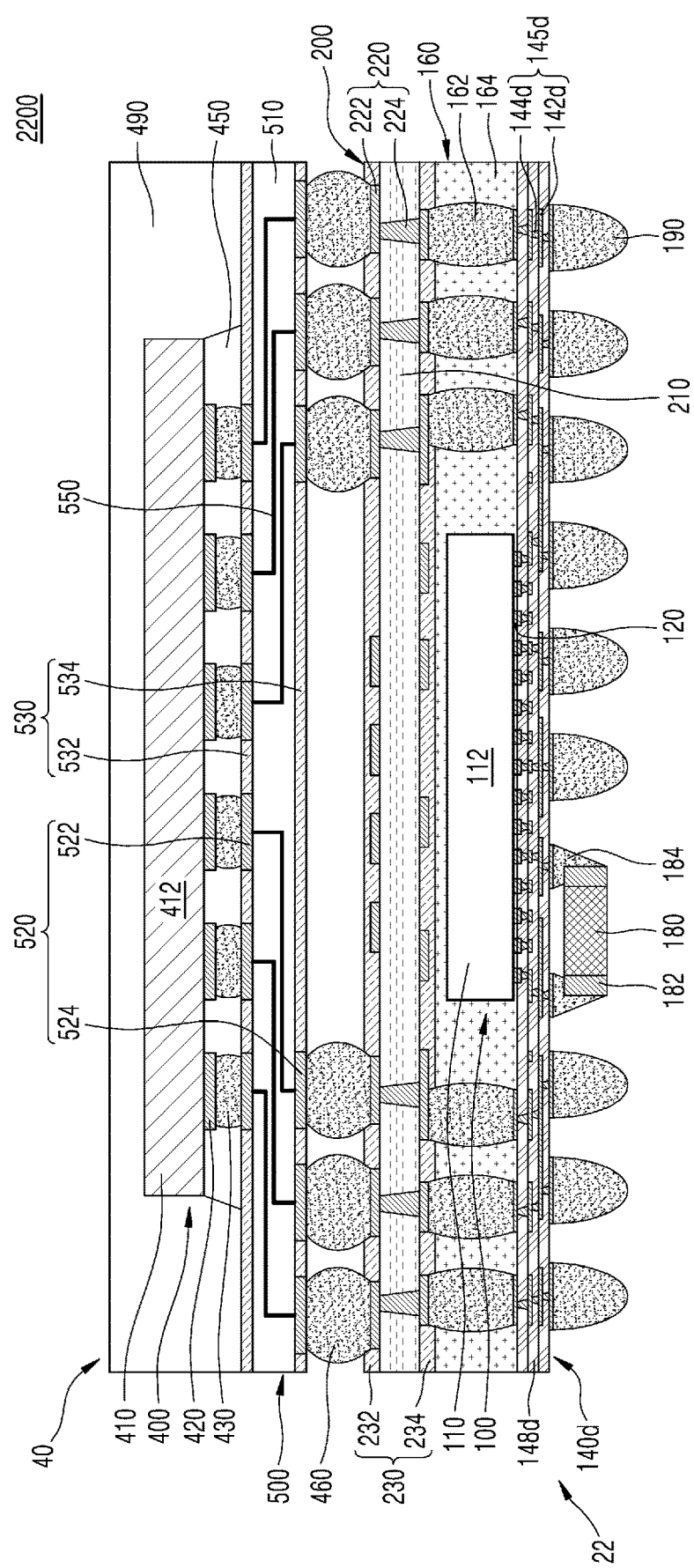

FIG. 13 is a cross-sectional view of a package on package having a semiconductor package, according to example embodiments of the inventive concept.

Referring to FIG. 13, the package on package 2200 may include the second semiconductor package 40 stacked on the first semiconductor package 22. The first semiconductor package 22 may be the lower semiconductor package, and the second semiconductor package 40 may be the upper semiconductor package. The first semiconductor package 22 may be substantially the same as the semiconductor package 22 described through FIG. 7, and the second semiconductor package 40 may be substantially the same as the second semiconductor package 40 described through FIG. 11, and thus detailed description thereof will be omitted.

Figure 14:
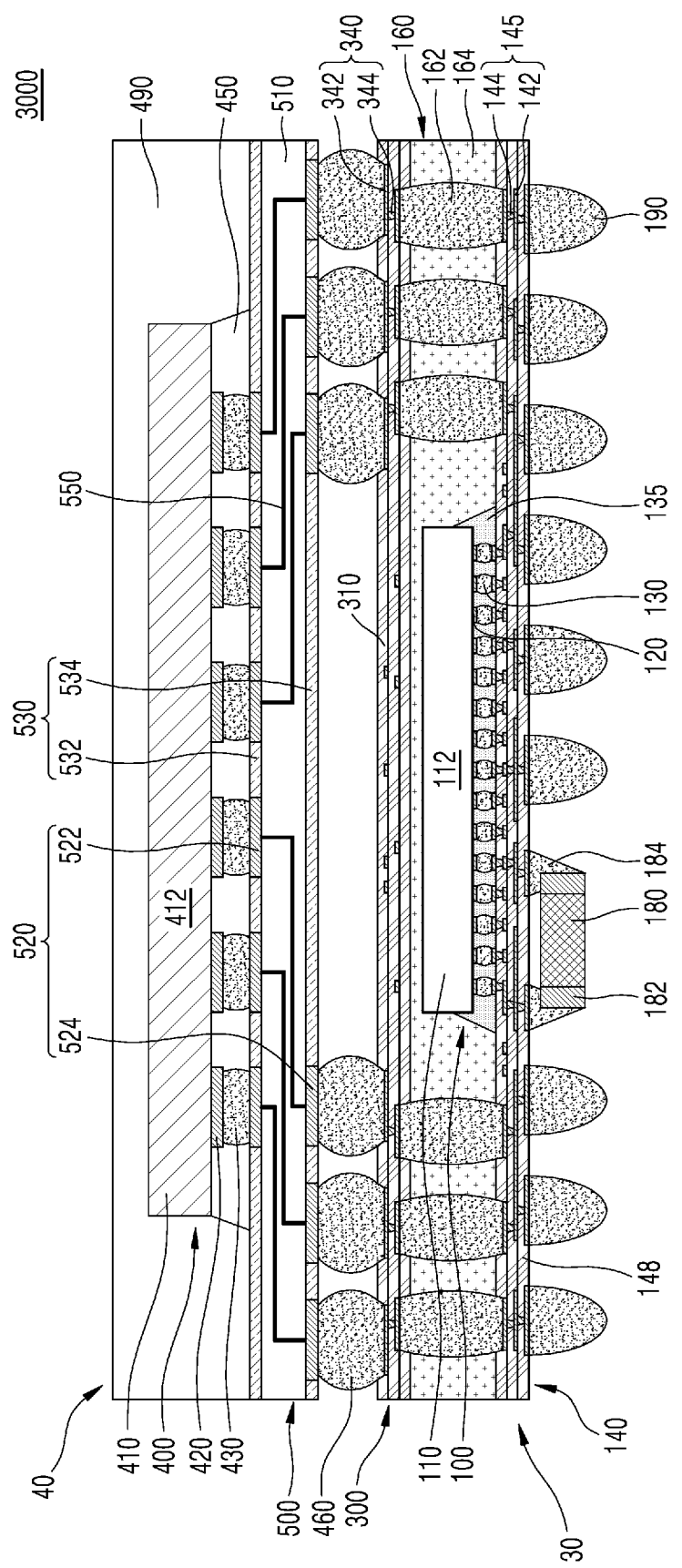

FIG. 14 is a cross-sectional view of a package on package having a semiconductor package, according to example embodiments of the inventive concept.

Referring to FIG. 14, the package on package 3000 may include the second semiconductor package 40 stacked on the first semiconductor package 30. The first semiconductor package 30 may be the lower semiconductor package, and the second semiconductor package 40 may be the upper semiconductor package. The first semiconductor package 30 may be substantially the same as the semiconductor package 22 described through FIG. 8, and the second semiconductor package 40 may be substantially the same as the second semiconductor package 40 described through FIG. 11, and thus detailed description thereof will be omitted.

Figure 15:
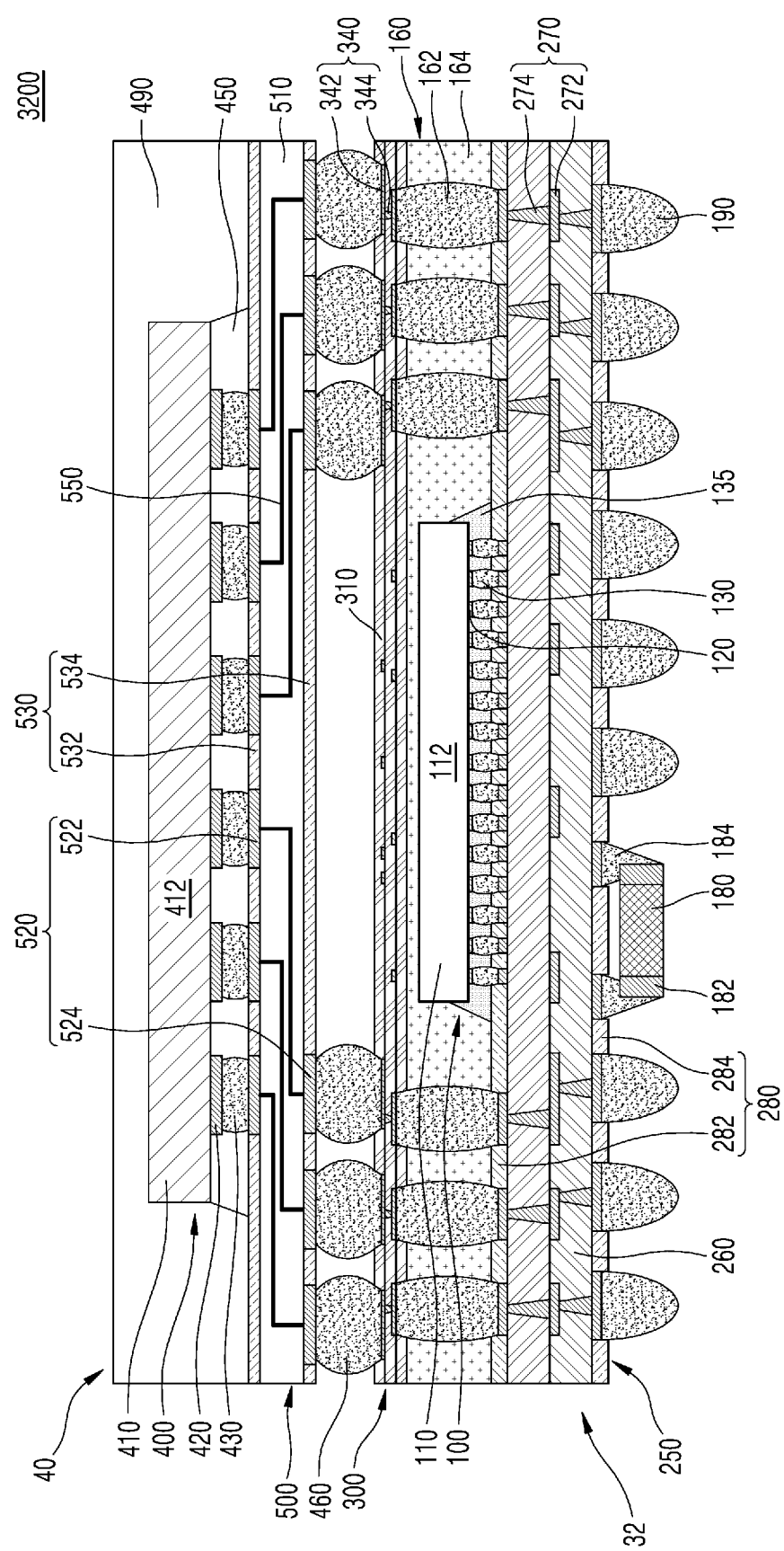

FIG. 15 is a cross-sectional view of a package on package having a semiconductor package, according to example embodiments of the inventive concept.

Referring to FIG. 15, the package on package 3200 may include the second semiconductor package 40 stacked on the first semiconductor package 32. The first semiconductor package 32 may be the lower semiconductor package, and the second semiconductor package 40 may be the upper semiconductor package. The first semiconductor package 32 may be substantially the same as the semiconductor package 32 described through FIG. 9, and the second semiconductor package 40 may be substantially the same as the second semiconductor package 40 described through FIG. 11, and thus detailed description thereof will be omitted.

While the inventive concept has been particularly shown and described with reference to embodiments thereof, it will be understood that various changes in form and details may be made therein without departing from the spirit and scope of the following claims.

What is claimed is:

1. A semiconductor package comprising:
a redistribution layer comprising a plurality of redistribution insulating layers, a plurality of redistribution line patterns that constitute lower wiring layers on upper and lower surfaces of each of the plurality of redistribution insulating layers, and a plurality of redistribution vias that are connected to some of the plurality of redistribution line patterns while penetrating at least one of the plurality of redistribution insulating layers;
at least one semiconductor chip arranged on the redistribution layer;
an expanded layer surrounding the at least one semiconductor chip on the redistribution layer; and
a cover wiring layer comprising at least one base insulating layer, a plurality of wiring patterns that constitute upper wiring layers on upper and lower surfaces of the at least one base insulating layer, including a plurality of upper wiring patterns on the upper surface of the at least one base insulating layer and a plurality of lower wiring patterns on the lower surface of the at least one base insulating layer, an upper surface solder resist layer covering an upper surface of the at least one base insulating layer and exposing portions of the plurality of upper wiring patterns, a lower surface solder resist layer covering a lower surface of the at least one base insulating layer and exposing portions of the plurality of lower wiring patterns, and a plurality of conductive vias that are connected to some of the plurality of wiring patterns while penetrating the at least one base insulating layer,
wherein the number of the lower wiring layers is greater than the number of the upper wiring layers,
wherein a first thickness of the redistribution layer is less than a second thickness of the cover wiring layer,
wherein a first pitch, which is a minimum pitch of the plurality of redistribution line patterns, is less than a second pitch, which is a minimum pitch of the plurality of wiring patterns,
wherein each lower wiring pattern among the plurality of lower wiring patterns that are connected to the plurality of conductive vias, is connected to only one of the plurality of conductive vias
wherein at least some of the plurality of redistribution line patterns are respectively connected to at least two of the plurality of redistribution vias,
wherein an upper surface of the expanded layer is in contact with the lower surface solder resist layer,
wherein a lower surface of the expanded layer is in contact with an uppermost redistribution insulating layer among the plurality of redistribution insulating layers, and
wherein a base angle of each of the plurality of redistribution vias is less than a base angle of each of the plurality of conductive vias.

2. The semiconductor package of claim 1, wherein a third thickness of one redistribution insulating layer of the plurality of redistribution insulating layers is less than a fourth thickness of the at least one base insulating layer.

3. The semiconductor package of claim 1, wherein a first width, which is a minimum width of the plurality of redistribution line patterns, is less than a second width, which is a minimum width of the plurality of wiring patterns.

4. The semiconductor package of claim 1, wherein a thickness of each of the upper surface solder resist layer and the lower surface solder resist layer is about 5 μm to about 15 μm.

5. The semiconductor package of claim 1, wherein each of the plurality of redistribution insulating layers comprises any one of photo imagable dielectric (PID) and photosensitive polyimide.

6. The semiconductor package of claim 1, wherein the cover wiring layer comprises a printed circuit board.

7. The semiconductor package of claim 1, wherein the expanded layer and the at least one base insulating layer are spaced apart from each other with the lower surface solder resist layer therebetween.

8. The semiconductor package of claim 1, wherein the expanded layer comprises a plurality of connection structures for electrically connecting the redistribution layer to the cover wiring layer, and a filling portion surrounding the plurality of connection structures and the at least one semiconductor chip.

9. The semiconductor package of claim 8,
wherein each of the plurality of connection structures comprises a through mold via (TMV), a conductive solder, a conductive pillar, or at least one conductive bump, and
wherein the filling portion comprises an epoxy mold compound.

10. The semiconductor package of claim 8,
wherein the cover wiring layer further comprises at least one conductive plate of a same material as the plurality of wiring patterns,
wherein the filling portion covers a side surface of the at least one semiconductor chip, but does not cover an inactive surface of the at least one semiconductor chip, and
wherein a thermal interface material is arranged between the at least one conductive plate and the inactive surface of the at least one semiconductor chip.

11. The semiconductor package of claim 1, wherein the expanded layer comprises a panel board having a mounting space in which the at least one semiconductor chip is arranged.

12. A semiconductor package comprising:
a redistribution layer comprising a plurality of redistribution insulating layers, each having a first thickness, and a redistribution conductive structure, wherein the redistribution conductive structure comprises a plurality of redistribution line patterns that constitute lower wiring layers on upper and lower surfaces of each of the plurality of redistribution insulating layers and a plurality of redistribution vias that are connected to some of the plurality of redistribution line patterns while penetrating at least one of the plurality of redistribution insulating layers, and wherein the redistribution layer has a second thickness;
at least one semiconductor chip arranged on the redistribution layer;
an expanded layer surrounding the at least one semiconductor chip on the redistribution layer; and
a cover wiring layer comprising at least one base insulating layer having a third thickness and a wiring structure, wherein the wiring structure comprises a plurality of wiring patterns that constitute upper wiring layers on upper and lower surfaces of the at least one base insulating layer, including a plurality of upper wiring patterns on the upper surface of the at least one base insulating layer and a plurality of lower wiring patterns on the lower surface of the at least one base insulating layer, an upper surface solder resist layer covering an upper surface of the at least one base insulating layer and exposing portions of the plurality of upper wiring patterns, a lower surface solder resist layer covering a lower surface of the at least one base insulating layer and exposing portions of the plurality of lower wiring patterns, and a plurality of conductive vias that are connected to some of the plurality of wiring patterns while penetrating the at least one base insulating layer, and wherein the cover wiring layer has a fourth thickness,
wherein the number of the lower wiring layers is greater than the number of the upper wiring layers,
wherein the first thickness is less than the third thickness and the second thickness is less than the fourth thickness,
wherein a first pitch, which is a minimum pitch of the plurality of redistribution line patterns, is less than a second pitch, which is a minimum pitch of the plurality of wiring patterns,
wherein each lower wiring pattern among the plurality of lower wiring patterns that are connected to the plurality of conductive vias, is connected to only one of the plurality of conductive vias
wherein at least some of the plurality of redistribution line patterns are respectively connected to at least two of the plurality of redistribution vias,
wherein an upper surface of the expanded layer is in contact with the lower surface solder resist layer,
wherein a lower surface of the expanded layer is in contact with an uppermost redistribution insulating layer among the plurality of redistribution insulating layers, and
wherein a base angle of each of the plurality of redistribution vias is less than a base angle of each of the plurality of conductive vias.

13. The semiconductor package of claim 12,
wherein each of the plurality of redistribution vias and each of the plurality of conductive vias comprise a tapered shape, where the tapered shape is narrowed in a horizontal width and extended from an upper side to a lower side.

14. The semiconductor package of claim 13,
wherein each of the plurality of redistribution vias comprises the tapered shape that is narrowed in the horizontal width from the lower side to the upper side and extended therebetween, and
wherein a portion of the redistribution conductive structure is in contact with a plurality of chip connection pads of the at least one semiconductor chip.

15. The semiconductor package of claim 13,
wherein each of the plurality of redistribution vias comprises the tapered shape that is narrowed in the horizontal width from the upper side to the lower side and extended therebetween, and
wherein the semiconductor package further comprises a plurality of chip connection terminals between a portion of a redistribution line pattern arranged in a lower wiring layer located at the uppermost among the plurality of redistribution line patterns and a plurality of chip connection pads of the at least one semiconductor chip.

16. The semiconductor package of claim 12, wherein each of the plurality of redistribution insulating layers comprises any one of photo imagable dielectric (PID) and photosensitive polyimide, and the cover wiring layer comprises a printed circuit board.

17. The semiconductor package of claim 12, wherein a first pitch, which is a minimum pitch of the plurality of redistribution line patterns, is about 10 μm to about 25 μm, and a second pitch, which is a minimum pitch of the plurality of wiring patterns, is about 150 μm to about 700 μm.

18. A package on package comprising:
a first semiconductor package comprising a redistribution layer, a first semiconductor chip, an expanded layer, and a cover wiring layer, wherein the redistribution layer comprises a plurality of redistribution insulating layers that each has a first thickness and a redistribution conductive structure, wherein the redistribution conductive structure comprises a plurality of redistribution line patterns that constitute lower wiring layers on upper and lower surfaces of each of the plurality of redistribution insulating layers and a plurality of redistribution vias that are connected to some of the plurality of redistribution line patterns while penetrating at least one of the plurality of redistribution insulating layers, and wherein the redistribution layer has a second thickness, wherein the first semiconductor chip is arranged on the redistribution layer and electrically connected to the redistribution conductive structure, wherein the expanded layer surrounds the first semiconductor chip, wherein the cover wiring layer comprises at least one base insulating layer having a third thickness greater than the first thickness and a wiring structure, wherein the wiring structure comprises a plurality of wiring patterns that constitute upper wiring layers on upper and lower surfaces of the at least one base insulating layer, including a plurality of upper wiring patterns on the upper surface of the at least one base insulating layer and a plurality of lower wiring patterns on the lower surface of the at least one base insulating layer, an upper surface solder resist layer covering an upper surface of the at least one base insulating layer and exposing portions of the plurality of upper wiring patterns, a lower surface solder resist layer covering a lower surface of the at least one base insulating layer and exposing portions of the plurality of lower wiring patterns, and a plurality of conductive vias that are connected to some of the plurality of wiring patterns while penetrating the at least one base insulating layer, and wherein the cover wiring layer has a fourth thickness greater than the second thickness; and
a second semiconductor package stacked on the first semiconductor package, wherein the second semiconductor package comprises at least one second semiconductor chip and package connection terminals that are attached to the portions of the plurality of upper wiring patterns to electrically connect the at least one second semiconductor chip to the first semiconductor package,
wherein a first pitch, which is a minimum pitch of the plurality of redistribution line patterns, is less than a second pitch, which is a minimum pitch of the plurality of wiring patterns,
wherein each lower wiring pattern among the plurality of lower wiring patterns that are connected to the plurality of conductive vias, is connected to only one of the plurality of conductive vias
wherein at least some of the plurality of redistribution line patterns are respectively connected to at least two of the plurality of redistribution vias,
wherein an upper surface of the expanded layer is in contact with the lower surface solder resist layer,
wherein a lower surface of the expanded layer is in contact with an uppermost redistribution insulating layer among the plurality of redistribution insulating layers, and
wherein a base angle of each of the plurality of redistribution vias is less than a base angle of each of the plurality of conductive vias.

19. The package on package of claim 18, wherein the first semiconductor chip comprises a central processing unit chip, a graphics processing unit chip, or an application processor chip, and the second semiconductor chip comprises a memory semiconductor chip.

20. The package on package of claim 18, further comprising:
at least one passive device electrically connected to the redistribution conductive structure and attached to a lower surface of the redistribution layer, and a plurality of external connection terminals,
wherein a fifth thickness, which is a thickness of the at least one passive device, is less than a sixth thickness, which is a thickness of each of the plurality of external connection terminals, and greater than the second thickness.

* * * * *